US010790333B2

United States Patent
Kim et al.

(10) Patent No.: US 10,790,333 B2
(45) Date of Patent: Sep. 29, 2020

(54) FLEXIBLE SUBSTRATE FOR USE WITH A PERPENDICULAR MAGNETIC TUNNEL JUNCTION (PMTJ)

(71) Applicant: Spin Memory, Inc.

(72) Inventors: Kuk-Hwan Kim, San Jose, CA (US); Marcin Gajek, Berkeley, CA (US); Dafna Beery, Palo Alto, CA (US); Amitay Levi, Cupertino, CA (US)

(73) Assignee: SPIN MEMORY, INC., Fremont, CA (US)

( * ) Notice: Subject to any disclaimer, the term of this patent is extended or adjusted under 35 U.S.C. 154(b) by 280 days.

(21) Appl. No.: 15/859,074

(22) Filed: Dec. 29, 2017

(65) Prior Publication Data

US 2019/0206933 A1    Jul. 4, 2019

(51) Int. Cl.
*H01L 27/22* (2006.01)
*H01L 51/00* (2006.01)
*H01L 43/12* (2006.01)
*H01L 43/08* (2006.01)
*H01L 51/05* (2006.01)
(Continued)

(52) U.S. Cl.
CPC .......... *H01L 27/228* (2013.01); *G11C 11/161* (2013.01); *G11C 11/1673* (2013.01); *G11C 11/1675* (2013.01); *H01L 21/6835* (2013.01); *H01L 27/1266* (2013.01); *H01L 27/283* (2013.01); *H01L 29/7869* (2013.01); *H01L 29/78603* (2013.01); *H01L 43/02* (2013.01); *H01L 43/08* (2013.01); *H01L 43/12* (2013.01); *H01L 51/0097* (2013.01); *H01L 51/0541* (2013.01); *H01L 51/0545* (2013.01); *H01L 29/66969* (2013.01); *H01L 2221/6835* (2013.01); *H01L 2221/68363* (2013.01); *H01L 2221/68368* (2013.01)

(58) Field of Classification Search
CPC H01L 27/228; H01L 21/6835; H01L 27/1266
See application file for complete search history.

(56) References Cited

U.S. PATENT DOCUMENTS

2020/0035560 A1 * 1/2020 Block ............ H01L 21/823475

OTHER PUBLICATIONS

Ahn et al., "High-Speed Mechanically Flexible Single-Crystal Silicon Thin-Film Transistors on Plastic Substrates," IEEE Electron Device Letters, vol. 27, No. 6, Jun. 2006, pp. 460-462.
(Continued)

*Primary Examiner* — Errol V Fernandes
(74) *Attorney, Agent, or Firm* — Zilka-Kotab, P.C.

(57) ABSTRACT

According to one embodiment, a method includes forming, at a low temperature, a thin film transistor structure above a flexible substrate in a film thickness direction. The low temperature is less than about 200° C., and the thin film transistor structure includes a contact pad on a lower or upper surface thereof. The method also includes forming, at a high temperature, a perpendicular magnetic tunnel junction (pMTJ) structure above a rigid substrate. The high temperature is greater than about 200° C. The method also includes removing the rigid substrate from below the pMTJ structure and bonding, at the low temperature, the pMTJ structure to the thin film transistor structure using an adhesion layer. Other methods of forming flexible substrates for mounting pMTJs and systems thereof are described in accordance with more embodiments.

9 Claims, 22 Drawing Sheets

(51) Int. Cl.

| | |
|---|---|
| *H01L 27/28* | (2006.01) |
| *H01L 43/02* | (2006.01) |
| *H01L 21/683* | (2006.01) |
| *H01L 29/786* | (2006.01) |
| *G11C 11/16* | (2006.01) |
| *H01L 27/12* | (2006.01) |
| *H01L 29/66* | (2006.01) |

(56) References Cited

OTHER PUBLICATIONS

Ahn et al., "Omnidirectional Printing of Flexible, Stretchable, and Spanning Silver Microelectrodes," Science, vol. 323, Mar. 20, 2009, pp. 1590-1593.

Rogers et al., "Materials and Mechanics for Stretchable Electronics," Science, vol. 327, Mar. 26, 2010, pp. 1603-1607.

Jeong et al., "Graphene Oxide Thin Films for Flexible Nonvolatile Memory Applications," Nano Letters, vol. 10, 2010, pp. 4381-4386.

Menard et al., "Bendable single crystal silicon thin film transistors formed by printing on plastic substrates," Applied Physics Letters, vol. 86, 2005, pp. 093507-1-093507-3.

Khang et al., "A Stretchable Form of Single-Crystal Silicon for High-Performance Electronics on Rubber Substrates," Science, vol. 311, Jan. 13, 2006, pp. 208-212.

Kim et al., "Resistive Switching Characteristics of Sol-Gel Zinc Oxide Films for Flexible Memory Applications," IEEE Transactions on Electron Devices, vol. 56, No. 4, Apr. 2009, pp. 696-699.

Cheng et al., "Low-Power High-Performance Non-Volatile Memory on a Flexible Substrate with Excellent Endurance," Advanced Materials, vol. 23, 2011, pp. 902-905.

Hirose et al., "A novel metal-to-metal bonding process through in-situ formation of Ag nanoparticles using Ag2O microparticles," IOP Publishing, Journal of Physics: Conference Series, vol. 165, 2009, pp. 1-6.

Kim et al., "Ultrathin Silicon Circuits With Strain-Isolation Layers and Mesh Layouts for High-Performance Electronics on Fabric, Vinyl, Leather, and Paper," Advanced Materials, vol. 21, No. 36, Sep. 2009, pp. 3703-3707.

Meitl et al., "Transfer printing by kinetic control of adhesion to an elastomeric stamp," Nature Materials, vol. 5, 2006, pp. 33-38.

Choi et al., "Biaxially Stretchable 'Wavy' Silicon Nanomembranes," Nano Letters, vol. 7, No. 6, May 2007, pp. 1655-1663.

Ha et al., "Curvilinear Electronics Formed Using Silicon Membrane Circuits and Elastomeric Transfer Elements," Curvilinear Silicon Electronics, Nano Small Micro, vol. 5, No. 23, Dec. 4, 2009, pp. 2703-2709.

Kim et al., "Flexible Memristive Memory Array on Plastic Substrates," Nano Letters, vol. 11, Oct. 2011, (with supporting information attached), 18 pages.

Kim et al., "Flexible and Stretchable Electronics for Biointegrated Devices," Annual Review of Biomedical Engineering, vol. 14, 2012, pp. 113-128.

Cao et al., "Medium-scale carbon nanotube thin-film integrated circuits on flexible plastic substrates," Nature Letters, vol. 454, Jul. 24, 2008, pp. 1-10.

Alarifi et al., "Silver Nanoparticle Paste for Low-Temperature Bonding of Copper," Journal of Electronic Materials, vol. 40, No. 6, 2011, pp. 1394-1402.

Ahn et al., "Heterogeneous Three-Dimensional Electronics by Use of Printed Semiconductor Nanomaterials," Science, vol. 314, Dec. 2006, pp. 1754-1757.

Kim et al., "Stretchable and Foldable Silicon Integrated Circuits," Science, vol. 320, Apr. 2008, pp. 507-511.

Lee et al., "Large-Area, Selective Transfer of Microstructured Silicon: a Printing-Based Approach to High-Performance Thin-Film Transistors Supported on Flexible Substrates," Advanced Materials, vol. 17, 2005, pp. 2332-2336.

Yoon et al., "Flexible concentrator photovoltaics based on microscale silicon solar cells embedded in luminescent waveguides," Nature Communications, Jun. 14, 2011, pp. 1-8.

* cited by examiner

FLEXIBLE SUBSTRATE FOR USE WITH A PERPENDICULAR MAGNETIC TUNNEL JUNCTION (PMTJ)

FIELD OF THE INVENTION

The present invention relates to magnetic random access memory (MRAM), and more particularly to providing a flexible substrate for use with a perpendicular magnetic tunnel junction (pMTJ).

BACKGROUND

Magnetic Random Access Memory (MRAM) is a non-volatile data memory technology that stores data using magnetoresistive cells, such as Magnetoresistive Tunnel Junction (MTJ) elements. At their most basic level, such MTJ elements include first and second magnetic layers that are separated by a thin, non-magnetic tunnel barrier layer, which may be constructed of an insulating barrier material, such as MgO, $Al_2O_3$, etc. The first magnetic layer, which may be referred to as a reference layer, has a magnetization that is fixed in a direction that is perpendicular to that of a plane of the layer. The second magnetic layer has a magnetization that is free to move so that it may be oriented in either of two directions that are both generally perpendicular to the plane of the free magnetic layer. Therefore, the magnetization of the free layer may be either parallel with the magnetization of the reference layer or anti-parallel with the direction of the reference layer (i.e., opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. Each electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When the orientations of the magnetizations of the free layer and the reference layer are oriented in the same direction, the spin of the electrons in the free layer are generally in the same direction as the orientation of the spin of the electrons in the reference layer. Because these electron spins are generally in the same direction, the electrons may pass relatively easily through the tunnel barrier layer. However, if the orientations of the magnetizations of the free layer and the reference layer are opposite to one another, the spin of electrons in the free layer will generally be opposite to the spin of electrons in the reference layer. In this case, electrons do not easily pass through the barrier layer, resulting in a higher electrical resistance through the MTJ stack.

Because the MTJ element may be switched between low and high electrical resistance states, it may be used as a memory element to store data. For example, the low resistance state may be read as a "1" or one, whereas the high resistance state may be read as a "0" or zero. In addition, because the magnetic orientation of the magnetic free layer remains in its switched state without any electrical power being provided to the element, the memory storage provided by the MTJ element is robust and non-volatile.

To write a bit of data to the MTJ cell, the magnetic orientation of the magnetic free layer is switched from a first direction to a second direction that is 180° from the first direction. This may be accomplished, for example, by applying a current through the MTJ element in a direction that is perpendicular to the planes of the layers of the MTJ element. An electrical current applied in one direction will switch the magnetization of the free layer to a first orientation, whereas an electrical current applied in a second direction will switch the magnetic of the free layer to a second, opposite orientation.

Once the magnetization of the free layer has been switched by the current, the state of the MTJ element may be read by detecting a voltage across the MTJ element, thereby determining whether the MTJ element is in a "1" or "0" bit state. Advantageously, once the switching electrical current has been removed, the magnetic state of the free layer will remain in the switched orientation until some other time when an electrical current is applied to switch the MTJ element to the opposite state. Therefore, the recorded data bit is non-volatile in that it remains intact (the magnetic orientation of the free layer does not change) in the absence of any electrical current being supplied.

SUMMARY

According to one embodiment, a method includes forming, at a low temperature, a thin film transistor structure above a flexible substrate in a film thickness direction. The low temperature is less than about 200° C., and the thin film transistor structure includes a contact pad on a lower or upper surface thereof. The method also includes forming, at a high temperature, a perpendicular magnetic tunnel junction (pMTJ) structure above a rigid substrate. The high temperature is greater than about 200° C. The method also includes removing the rigid substrate from below the pMTJ structure and bonding, at the low temperature, the pMTJ structure to the thin film transistor structure using an adhesion layer.

In another embodiment, a method includes forming, at a low temperature, a gate layer above a flexible substrate in a film thickness direction, forming, at the low temperature, a gate oxide layer above the gate layer and exposed portions of the flexible substrate that are not covered by the gate layer in the film thickness direction, the gate oxide layer electrically insulating the gate layer from layers formed thereabove, forming, at the low temperature, a channel layer above the gate oxide layer in the film thickness direction, forming, at the low temperature, a source layer and a drain layer above the channel layer in the film thickness direction, and forming, at the low temperature, an insulative layer above the source layer, the drain layer, and exposed portions of the channel layer in the film thickness direction. The low temperature is less than about 200° C., and the source layer is separated from the drain layer by a portion of the insulative layer. The method also includes removing, at the low temperature, a portion of the insulative layer that is positioned above the drain layer to form a contact hole, the contact hole exposing a top edge of the drain layer, and forming, at the low temperature, a contact pad layer in the contact hole and above a portion of the insulative layer, the contact pad including a low temperature bonding conductive material. An upper portion of the contact pad layer extends beyond extents of the drain layer in an element thickness direction perpendicular to the film thickness direction.

In accordance with another embodiment, a method includes forming a sacrificial buried layer above a rigid substrate in a film thickness direction, forming a lower adhesion layer above the sacrificial buried layer in the film thickness direction, forming a bottom electrode layer above the lower adhesion layer in the film thickness direction, forming a pMTJ above the bottom electrode layer in the film thickness direction, forming an upper electrode layer above the pMTJ in the film thickness direction, patterning the adhesion layer, the bottom electrode, the pMTJ, and the upper electrode layer to form a pillar via a material removal process, forming an insulative layer around the pillar to an upper extent of the upper electrode layer in the film thickness direction, forming a channel through the insulative layer that is separated from a side of the pillar by a portion of the insulative layer, and forming a bit line layer above the insulative layer, an exposed portion of the sacrificial buried layer and the upper electrode layer, and along sides of the channel.

These and other features and advantages of the invention will be apparent to one of skill in the art upon reading of the following detailed description of the embodiments in conjunction with the figures. In the figures, like reference numerals used in more than one figure indicate a like element, and may be considered in light of the description of the like element presented in any of the other figures having the like element.

BRIEF DESCRIPTION OF THE DRAWINGS

For a fuller understanding of the nature and advantages of this invention, as well as the preferred mode of use, reference should be made to the following detailed description read in conjunction with the accompanying drawings. The drawings are not presented to scale unless specified otherwise on an individual basis.

DETAILED DESCRIPTION

Figure 1:
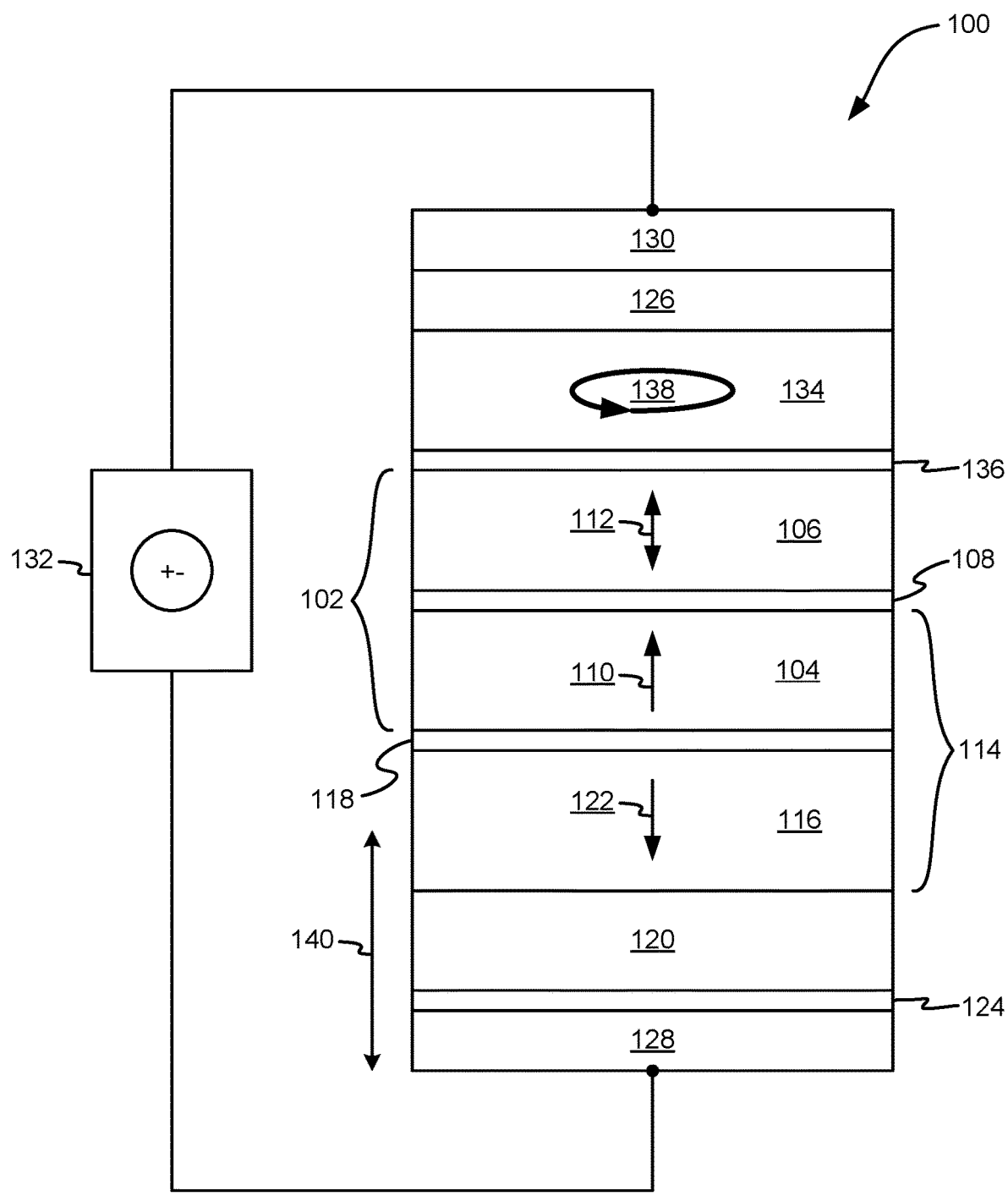
FIG. 1 is a schematic, cross-sectional view of a portion of a magnetic memory element, which may be used in embodiments of the invention.

The following description includes the best embodiments presently contemplated for carrying out the invention. This description is made for the purpose of illustrating the general principles of this invention and is not meant to limit the inventive concepts claimed herein in any way.

Unless otherwise specifically defined herein, all terms are to be given their broadest possible interpretation including meanings implied from the specification as well as meanings understood by those skilled in the art and/or as defined in dictionaries, treatises, etc. It must also be noted that, as used in the specification and the appended claims, the singular forms "a," "an," and "the" include plural referents unless otherwise specified.

Moreover, the term "about" when used herein to modify a value indicates a range that includes the value and less and greater than the value within a reasonable range. In the absence of any other indication, this reasonable range is plus and minus 10% of the value. For example, "about 10 nanometers" indicates 10 nm±1 nm, such that the range includes all values in a range including 9 nm up to and including 11 nm.

Also, the term "comprise" indicates an inclusive list of those elements specifically described without exclusion of any other elements. For example, "a list comprises red and green" indicates that the list includes, but is not limited to, red and green. Therefore, the list may also include other colors not specifically described.

According to one general embodiment, a method includes forming, at a low temperature, a thin film transistor structure above a flexible substrate in a film thickness direction. The low temperature is less than about 200° C., and the thin film transistor structure includes a contact pad on a lower or upper surface thereof. The method also includes forming, at a high temperature, a perpendicular magnetic tunnel junction (pMTJ) structure above a rigid substrate. The high temperature is greater than about 200° C. The method also includes removing the rigid substrate from below the pMTJ structure and bonding, at the low temperature, the pMTJ structure to the thin film transistor structure using an adhesion layer.

In another general embodiment, a method includes forming, at a low temperature, a gate layer above a flexible substrate in a film thickness direction, forming, at the low temperature, a gate oxide layer above the gate layer and exposed portions of the flexible substrate that are not covered by the gate layer in the film thickness direction, the gate oxide layer electrically insulating the gate layer from layers formed thereabove, forming, at the low temperature, a channel layer above the gate oxide layer in the film thickness direction, forming, at the low temperature, a source layer and a drain layer above the channel layer in the film thickness direction, and forming, at the low temperature, an insulative layer above the source layer, the drain layer, and exposed portions of the channel layer in the film thickness direction. The low temperature is less than about 200° C., and the source layer is separated from the drain layer by a portion of the insulative layer. The method also includes removing, at the low temperature, a portion of the insulative layer that is positioned above the drain layer to form a contact hole, the contact hole exposing a top edge of the drain layer, and forming, at the low temperature, a contact pad layer in the contact hole and above a portion of the insulative layer, the contact pad including a low temperature bonding conductive material. An upper portion of the contact pad layer extends beyond extents of the drain layer in an element thickness direction perpendicular to the film thickness direction.

In accordance with another general embodiment, a method includes forming a sacrificial buried layer above a rigid substrate in a film thickness direction, forming a lower adhesion layer above the sacrificial buried layer in the film thickness direction, forming a bottom electrode layer above the lower adhesion layer in the film thickness direction, forming a pMTJ above the bottom electrode layer in the film thickness direction, forming an upper electrode layer above the pMTJ in the film thickness direction, patterning the adhesion layer, the bottom electrode, the pMTJ, and the upper electrode layer to form a pillar via a material removal process, forming an insulative layer around the pillar to an upper extent of the upper electrode layer in the film thickness direction, forming a channel through the insulative layer that is separated from a side of the pillar by a portion of the insulative layer, and forming a bit line layer above the insulative layer, an exposed portion of the sacrificial buried layer and the upper electrode layer, and along sides of the channel.

Referring to FIG. 1, a magnetic memory element 100 is shown according to one embodiment. The memory element 100 may be used in a perpendicular magnetic tunnel junction (pMTJ) memory element, as described in various embodiments herein. The memory element 100 may include a magnetic tunnel junction (MTJ) 102 that may include a magnetic reference layer 104, a magnetic free layer 106, and a thin, non-magnetic, electrically-insulating magnetic barrier layer 108 positioned between the reference layer 104 and the free layer 106 in a film thickness direction 140. The barrier layer 108 may include an oxide, such as MgO, $Al_2O_3$, etc., or some other suitable material known in the art. The reference layer 104 has a magnetization 110 that is fixed in a direction that is perpendicular to a horizontal plane of the layer, as indicated by the arrow. The horizontal plane is sometimes referred to as a plane of formation in the embodiments described herein. The free layer 106 has a magnetization 112 that may be in either of two directions perpendicular to a horizontal plane of the free layer 106, as indicated by the two arrows. While the magnetization 112 of the free layer 106 remains in either of two directions perpendicular to the plane of the free layer 106 in a quiescent state, it may be selectable switched between these two directions, as is described in greater detail herein. When the magnetization 112 of the free layer 106 is in the same direction as the magnetization 110 of the reference layer 104, the electrical resistance across the MTJ 102 is at a low resistance state. Conversely, when the magnetization 112 of the free layer 106 is opposite to the magnetization 110 of the reference layer 104, the electrical resistance across the MTJ 102 is in a high resistance state.

The reference layer 104 may be part of an anti-parallel magnetic pinning structure 114 that may include a magnetic pinned layer 116 and a non-magnetic, antiparallel coupling layer 118 positioned between the pinned layer 116 and the reference layer 104 in the film thickness direction 140. The antiparallel coupling layer 118 may comprise any suitable material known in the art, such as Ru, and may be constructed to have a thickness that causes ferromagnetic antiparallel coupling of the pinned layer 116 and the reference layer 104.

In one approach, the pinned layer 116 may be exchange coupled with an antiferromagnetic layer 120, which may comprise any suitable material known in the art, such as IrMn. Exchange coupling between the antiferromagnetic layer 120 and the pinned layer 116 strongly pins the magnetization 122 of the pinned layer 116 in a first direction. The antiparallel coupling between the pinned layer 116 and the reference layer 104 pins the magnetization 110 of the reference layer 104 in a second direction opposite to the direction of magnetization 122 of the pinned layer 116.

According to one approach, a seed layer 124 may be positioned below the pinned layer 116 in the film thickness direction 140 to initiate a desired crystalline structure in the layers deposited thereabove.

In another approach, a capping layer 126 may be positioned above the free layer 106 to protect the underlying layers during manufacture, such as during high temperature annealing.

A lower electrode 128 and an upper electrode 130 may be positioned near a bottom and a top of the memory element 100, respectively, in one approach. The lower electrode 128 and the upper electrode 130 may be constructed of a non-magnetic, electrically conductive material of a type known in the art, such as Ru, Au, Ag, Cu, etc., and may provide an electrical connection with a circuit 132. The circuit 132 may include a current source, and may further include circuitry for reading an electrical resistance across the memory element 100.

The magnetic free layer 106 has a magnetic anisotropy that causes the magnetization 112 of the free layer 106 to remain stable in one of two directions perpendicular to the horizontal plane of the free layer 106. In a write mode of use for the memory element 100, the orientation of the magnetization 112 of the free layer 106 may be switched between these two directions by applying an electrical current through the memory element 100 via the circuit 132. A current in a first direction causes the magnetization 112 of the free layer 106 of the memory element 100 to flip to a first orientation, and a current in a second direction opposite to the first direction causes the magnetization 112 of the free layer 106 of the memory element 100 to flip to a second, opposite direction.

For example, if the magnetization 112 is initially oriented in an upward direction in FIG. 1, applying a current in a downward direction through the memory element 100 causes electrons to flow in an opposite direction upward through the memory element 100. Electrons travelling through the reference layer 104 become spin polarized as a result of the magnetization 110 of the reference layer 104. These spin-polarized electrons cause a spin torque on the magnetization 112 of the free layer 106, which causes the magnetization 112 to flip directions, from the upward direction to a downward direction.

On the other hand, if the magnetization 112 of the free layer 106 is initially in a downward direction in FIG. 1, applying an electrical current through the memory element 100 in an upward direction in FIG. 1 causes electrons to flow in an opposite direction, downward through the memory element 100. However, because the magnetization 112 of the free layer 106 is opposite to the magnetization 110 of the reference layer 104, the electrons will not be able to pass through the barrier layer 108. As a result, the electrons (which have been spin polarized by the magnetization 112 of the free layer 106) will accumulate at the junction between the free layer 106 and the barrier layer 108. This accumulation of spin polarized electrons causes a spin torque that causes the magnetization 112 of the free layer 106 to flip from the downward direction to an upward direction.

In order to assist the switching of the magnetization 112 of the free layer 106, the memory element 100 may include a spin polarization layer 134 positioned above the free layer 106. The spin polarization layer 134 may be separated from the free layer 106 by an exchange coupling layer 136. The spin polarization layer 134 has a magnetic anisotropy that causes it to have a magnetization 138 with a primary component oriented in the in plane direction (e.g., perpendicular to the magnetization 112 of the free layer and the magnetization 110 of the reference layer 104). The magnetization 138 of the spin polarization layer 134 may be fixed in one approach, or may move in a precessional manner as shown in FIG. 1. The magnetization 138 of the spin polarization layer 134 causes a spin torque on the free layer 106 that assists in moving its magnetization 112 away from its quiescent state perpendicular to the plane of the free layer 106. This allows the magnetization 112 of the free layer 106 to more easily flip with less energy being utilized to flip the magnetization 112 in response to applying a write current to the memory element 100.

The memory element 100 described in FIG. 1 is intended to provide context to the various embodiments described herein. The structures and methods described herein in accordance with various embodiments may comprise a portion of the memory element 100 described in FIG. 1 and/or used in conjunction with the memory element 100, in various approaches.

Figure 2:
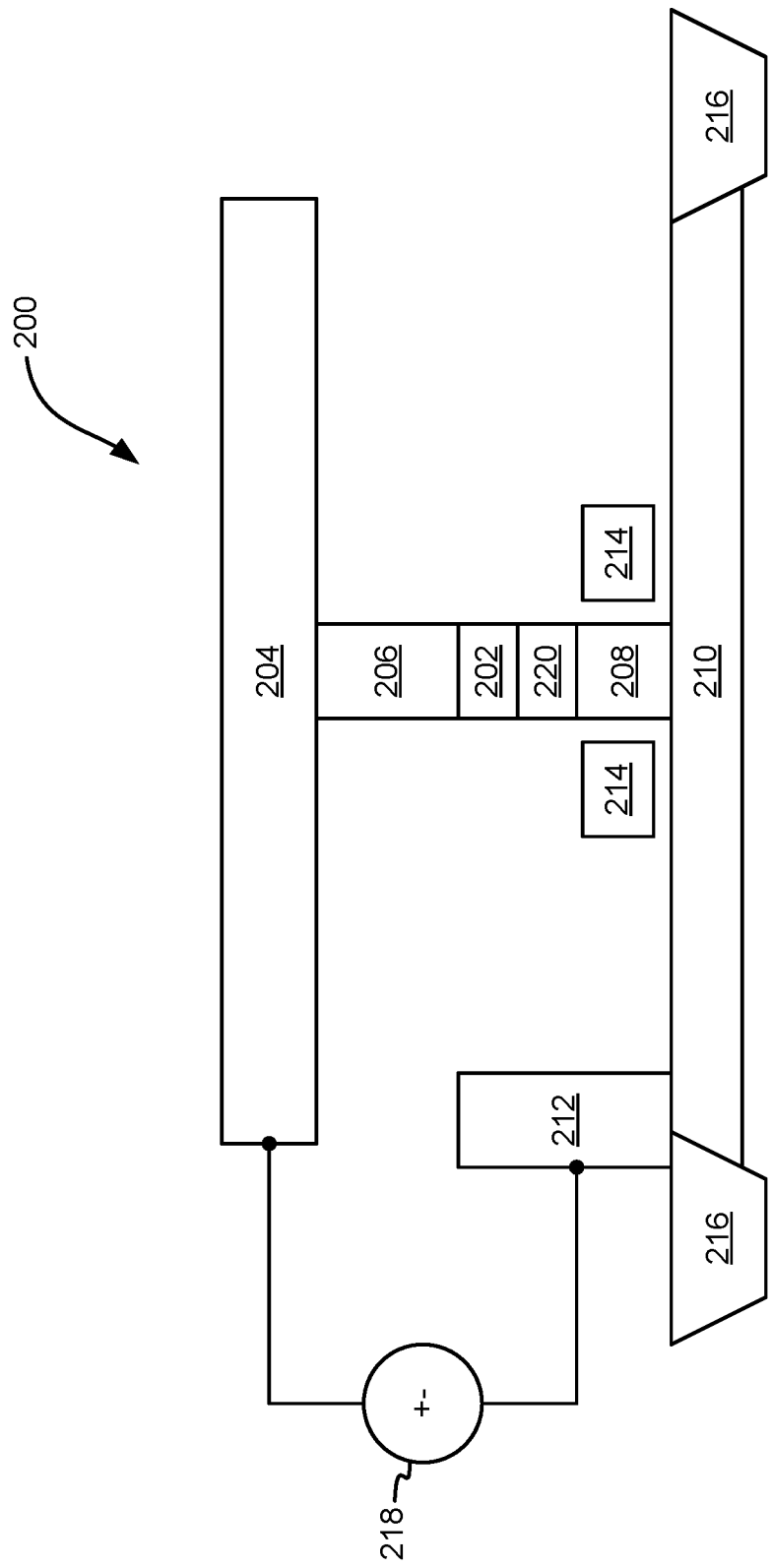
FIG. 2 is a schematic, cross-sectional view of a portion of a magnetic random access memory (MRAM) that includes a magnetoresistive sensor, which may be used in embodiments of the invention.

Now referring to FIG. 2, a portion of a magnetic random access memory (MRAM) structure 200 that includes a magnetoresistive sensor 202 is shown according to one embodiment. The MRAM structure 200 may be operated and utilized as understood by those of skill in the art, with any special use cases being specified in accordance with an embodiment herein. The memory element 100 described in FIG. 1 may be used as the magnetoresistive sensor 202 of FIG. 2 in accordance with embodiments that store data in MRAM. In one embodiment, an MTJ element may be used as the magnetoresistive sensor 202.

The MRAM structure 200 includes a bit line 204 that supplies current across the magnetoresistive sensor 202 from a voltage source 218. The bit line 204 may comprise any suitable material known in the art, such as TaN, W, TiN, Au, Ag, Cu, etc. An extension layer 206 electrically couples the magnetoresistive sensor 202 with the bit line 204. The extension layer 206 may comprise any suitable material known in the art, such as Ru, Ta, etc. A source terminal 220 is coupled between the magnetoresistive sensor 202 and a channel layer 208, which is in electrical contact with a n+source layer 210. The channel layer 208 may comprise any suitable semiconductor material known in the art, such as Si, Ge, GaAs-compounds, etc. The n+source layer 210 may comprise any suitable material known in the art, such as TaN, W, TiN, Au. Ag, Cu, etc., and is electrically coupled to the voltage source 218 via a source line 212, which may comprise any suitable material known in the art, such as TaN, W, TiN, Au, Ag, Cu, etc. Positioned across the channel layer 208 is a word line 214 which may comprise any suitable material known in the art, such as TaN, W, TiN, Au, Ag, Cu, etc. On either side of the n+source layer 210 are shallow trench isolation (STI) layers 216 which provide electrical insulation between an adjacent n+source layer 210. Moreover, although not specifically shown, electrically insulative material may be positioned around the various layers shown in FIG. 2, as would be understood by one of skill in the art.

Electronics have been moving toward being flexible (such as for use in materials that bend (e.g., fabrics, clothing, etc.), for providing enhanced operation, etc.), while still benefitting from fast memory types that exhibit robust rewritability. Conventional memory manufacturing processes require high temperatures, which are not suitable for flexible substrates that are available for use in the manufacturing processes.

In one embodiment, operation of a memory may be improved and/or enhanced by applying tensile stress to the pMTJ element thereof, which enhances the tunneling magnetoresistive effect that is produced by the pMTJ. However, a pMTJ that is formed above a rigid substrate is not able to experience this benefit from tensile stress. In order to provide a pMTJ on a flexible substrate, several modifications are described herein in accordance with several embodiments that aid in and/or make possible such a device.

Figure 3:
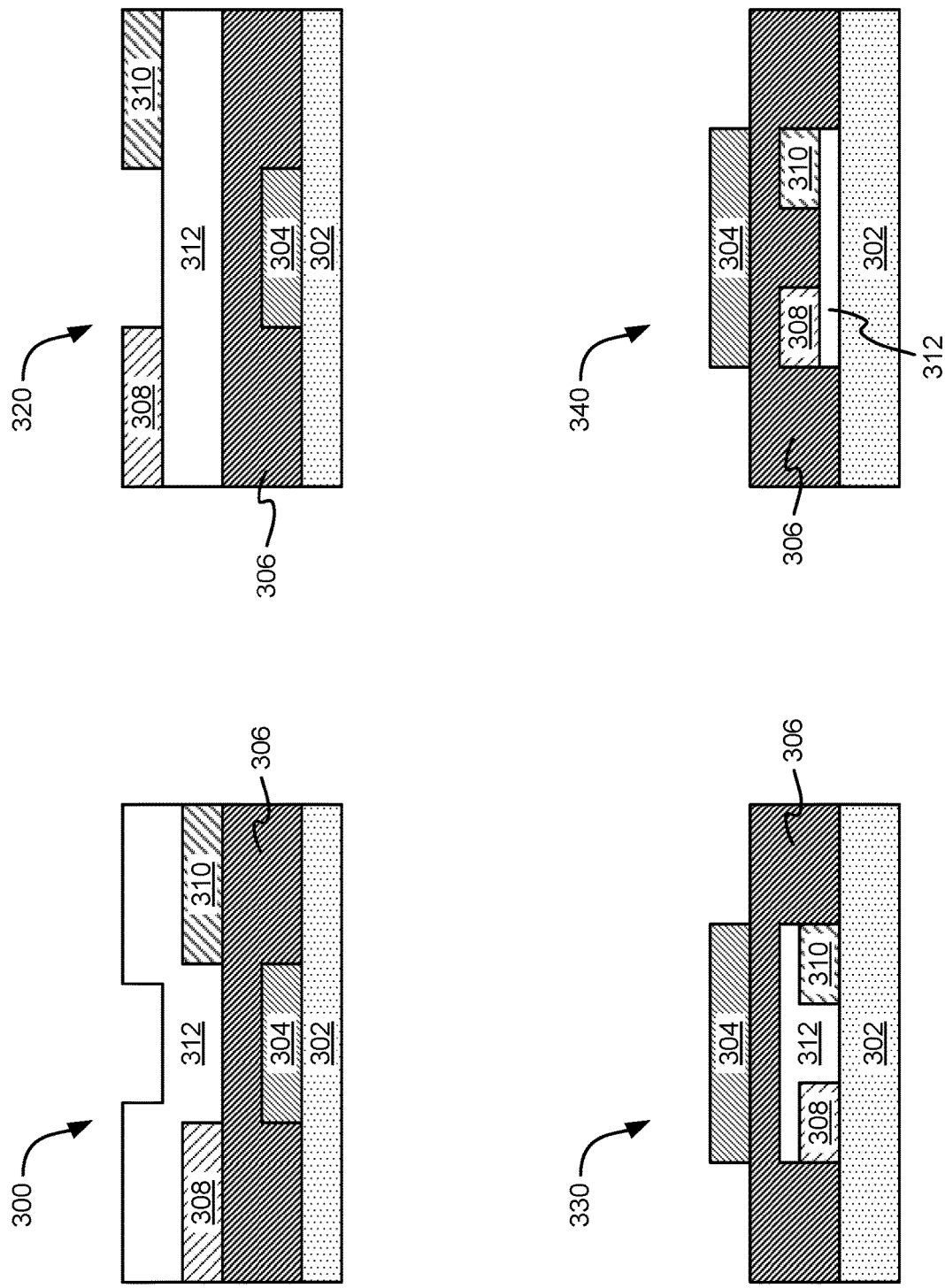
FIG. 3 shows four thin film access transistor structures, in several embodiments.

FIG. 3A-3D show different embodiments of thin film access transistor structures. Referring now to FIG. 3A, a thin film access transistor structure 300 is shown according to a first embodiment. The thin film access transistor structure 300 utilizes a bottom gate and bottom contact (BG/BC) architecture. As shown, the thin film access transistor structure 300 comprises a substrate 302 (constructed with rigid or flexible material), a gate layer 304 disposed above the substrate 302, a gate oxide layer 306 positioned above and around the gate layer 304 to electrically insulate the gate layer 304 from layers positioned thereabove. In addition, the thin film access transistor structure 300 includes a source layer 308 and a drain layer 310 disposed above the gate oxide layer 306 separated from one another by a channel layer 312, disposed above and between the source layer 308 and the drain layer 310. The positioning of the source layer 308 and the drain layer 310 may be swapped, in another embodiment, an effect that may be visualized by observing the structure 300 from a reverse perspective.

The various layers in each of FIGS. 3A-3D may comprise any suitable material flexible substrate material known in the art, such as plastic that is processed for high mobility (conductivity). In some approaches, the substrate 302 may comprise polyimide, polyether ether ketone (PEEK), polyethylene naphthalate (PEN), transparent conductive polyester film, and/or combinations thereof. The gate layer 304 may comprise doped polysilicon, W, TaN, TiNi, TiN, similar suitable materials, and/or combinations thereof. In addition, the gate oxide layer 306 may comprise a dielectric, such as $SiO_2$, $Al_2O_3$, $HfO_2$, etc., or some other suitable substrate material, and/or combinations thereof. The source layer 308 and the drain layer 310 may each comprise Pt, Ir, Pd, Au, Ti, Ta, Cu, Indium Tin Oxide (ITO), and/or similar suitable materials known in the art which are able to form ohmic or low-barrier Schottky contact with doped regions of the channel layer 312. The channel layer 312 may comprise $ZnO_2$, InZnO, InGaZnO, pentacene, poly(3-hexylthiophene) (P3HT), alkyl-substituted triphenylamine polymers (PTAA), similar suitable materials known in the art, and/or combinations thereof. The channel layer 312 may also be fully or partially doped (such as in regions that contact the source layer 308 and/or the drain layer 310), such as with oxygen vacancies, Al, P, As, N, etc. Oxygen vacancies and traps are also regarded as dopants for organic thin film channel materials, such as P3HT, PTAA, and pentacene.

Of course, other materials that are known in the art may be used, as would be apparent to one of skill upon reading the present descriptions.

As shown in FIG. 3B, a thin film access transistor structure 320 is shown according to a second embodiment. The thin film access transistor structure 320 utilizes a bottom gate and top contact (BG/TC) architecture. As shown, the thin film access transistor structure 320 comprises a substrate 302 (constructed with rigid or flexible material), a gate layer 304 disposed above the substrate 302, a gate oxide layer 306 positioned above and around the gate layer 304 to electrically insulate the gate layer 304 from layers positioned thereabove. In addition, the thin film access transistor structure 320 includes a channel layer 312 that is deposited full film across an upper edge of the gate oxide layer 306. A source layer 308 and a drain layer 310 are disposed above the channel layer 312 separated from one another, typically by an insulative material, like a dielectric. The positioning of the source layer 308 and the drain layer 310 may be swapped, in another embodiment, an effect that may be visualized by observing the structure 320 from a reverse perspective.

Now referring to FIG. 3C, a thin film access transistor structure 330 is shown according to a third embodiment. The thin film access transistor structure 330 utilizes a top gate and bottom contact (TG/BC) architecture. As shown, the thin film access transistor structure 330 comprises a substrate 302 (constructed with rigid or flexible material), a gate oxide layer 306 disposed above the substrate 302 with a gap therethrough in a center portion in which a source layer 308 and a drain layer 310 are disposed, separated by a lower portion of a channel layer 312, with an upper portion of the channel layer 312 being positioned above the upper edges of the source layer 308 and the drain layer 310. The upper portion of the channel layer 312, the source layer 308, and the drain layer 310 are enclosed on an upper side thereof by an upper portion of the gate oxide layer 306. Moreover, the thin film access transistor structure 330 includes a gate layer 304 positioned above a center portion of the gate oxide layer 306 that is electrically insulated from layers positioned therebelow by the gate oxide layer 306. The positioning of the source layer 308 and the drain layer 310 may be swapped, in another embodiment, an effect that may be visualized by observing the structure 330 from a reverse perspective.

With reference to FIG. 3D, a thin film access transistor structure 340 is shown according to a fourth embodiment. The thin film access transistor structure 340 utilizes a top gate and top contact (TG/TC) architecture. As shown, the thin film access transistor structure 340 comprises a substrate 302 (constructed with rigid or flexible material), a channel layer 312 disposed above a central portion of the substrate 302. Above the channel layer 312, a source layer 308 and a drain layer 310 are disposed, separated by a gate oxide layer 306 that is formed above the substrate, the channel layer 312, the source layer 308, and the drain layer 310. Above a central portion of the gate oxide layer 306 is a gate layer 304, that is electrically insulated from layers positioned therebelow by the gate oxide layer 306. The positioning of the source layer 308 and the drain layer 310 may be swapped, in another embodiment, an effect that may be visualized by observing the structure 340 from a reverse perspective.

Of course, other arrangements of the various layers described in FIGS. 3A-3D may be used in conjunction with the various embodiments described herein, as would be understood by one of skill in the art upon reading the present descriptions.

Any suitable materials may be used to form the various layers in FIGS. 3A-3D, as would be known to one of skill in the art. In various approaches, the substrate 302 may comprise $SiO_2$, $Al_2O_3$, $HfO_2$, combinations thereof, etc., the source layer 308 and the drain layer 310 may each comprise Pt, Ir, Pd, Au, Ti, Ta, Cu, ITO, and/or similar suitable materials known in the art which are able to form ohmic or low-barrier Schottky contact with doped regions of the channel layer 312, the channel layer 312 may comprise $ZnO_2$, InZnO, InGaZnO, pentacene, P3HT, PTAA, similar suitable materials known in the art, and/or combinations thereof, the gate oxide layer 306 may comprise $SiO_2$, SiON, $ZrO_2$, $HfO_2$, and $Al_2O_3$, combinations thereof, etc., and the gate layer 304 may comprise may comprise doped polysilicon, W, TaN, TiNi, TiN, similar suitable materials, and/or combination thereof. In some embodiments, the channel layer 312 may also be fully or partially doped (such as in regions that contact the source layer 308 and/or the drain layer 310), such as with oxygen vacancies, Al, P, As, N, etc. Oxygen vacancies and traps are also regarded as dopants for organic thin film channel materials, such as P3HT, PTAA, and pentacene.

Any of the various thin film transistor structures in FIGS. 3A-3D may be processed through for high mobility ZnO, InZnGaO, and InZnO type transistors, in some embodiments.

Figure 4A:
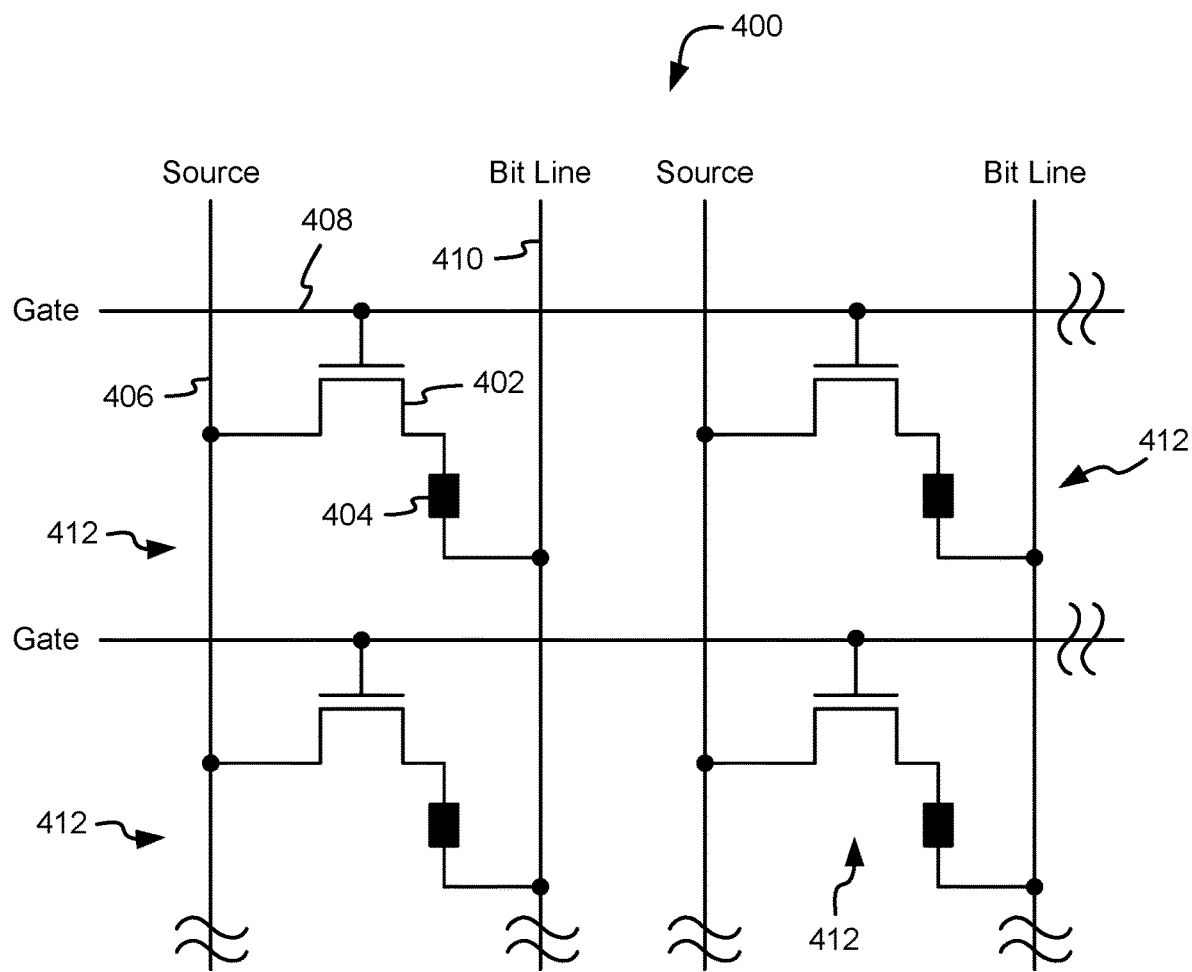
FIG. 4A shows a circuit diagram of a portion of an acceptor structure according to one embodiment.

Now referring to FIG. 4A, a circuit diagram of a portion of an acceptor structure 400 is shown according to one embodiment. The acceptor structure 400 or some portion thereof may be used in the various embodiments disclosed herein, such as to enable transfer of a pMTJ to the acceptor structure 400 from a donor structure, and to provide electrical connections to appropriate portions of the device transferred to the acceptor structure 400.

As shown, each cell includes an transistor 402 and a pMTJ 404 coupled in series across a source line 406 and a bit line 410. Each transistor 402 is also connected to a gate pad 408. A plurality of cells 412 may be included in the acceptor structure 400 that are about equal to a number of cells in a donor structure. Each cell 412 may include the transistor 402 and the pMTJ 404 coupled in series with connections for the source line 406 and the bit line 410 and a pad for the gate 408.

Figure 4B:
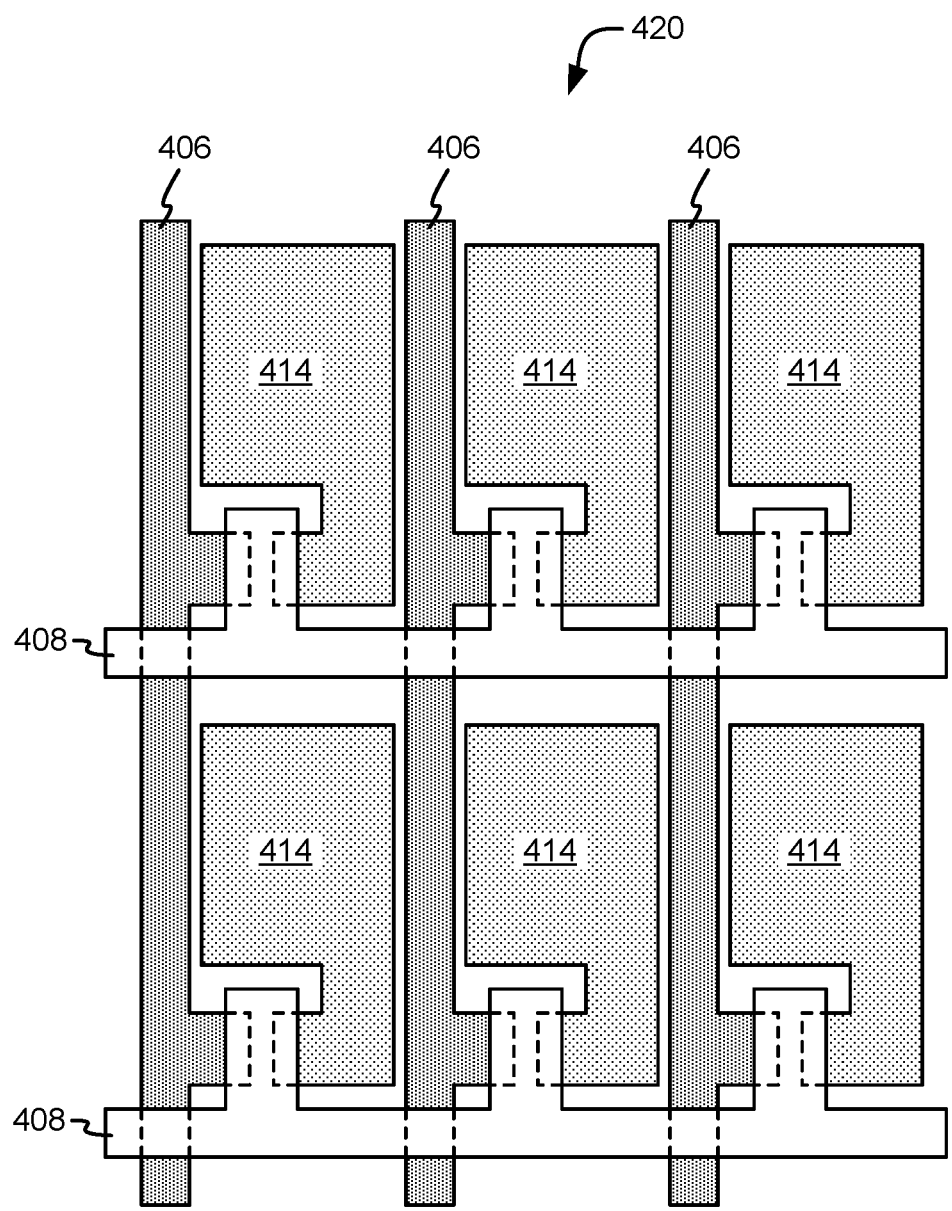
FIG. 4B shows a simplified layout of an acceptor structure, in one embodiment.

Now referring to FIG. 4B, a simplified layout of an acceptor structure 420 is shown according to one embodiment. Three layers are shown; however, more layers may be included in the acceptor structure 420, including dielectric layer(s), other connections, etc. As shown, a source line 406 and a connection pad 414 are disposed below a gate layer 408, with connections being made between the source line 406 and the gate layer 408, and between the connection pad 414 and the gate layer 408. The connection pad 414 in each cell has a larger surface area to allow for more secure electrical coupling with a conductive layer positioned thereabove in a transfer operation. A transistor is positioned at the junction of the connection pad 414, the source line 406, and the gate layer 408 in one embodiment.

With reference to FIGS. 5A-5F, formation of an acceptor structure is shown according to one embodiment. The an acceptor structure may be formed in accordance with the present invention in any of the environments depicted in FIGS. 1-4B, among others not specifically described, in various approaches. Of course, more steps, layers, and/or structures may be utilized in the formation of any of the structures and/or layers thereof than those specifically described in FIGS. 5A-5F, as would be understood by one of skill in the art upon reading the present descriptions.

Each of the intermediate structures shown in FIGS. 5A-5F may be formed by any suitable component of the operating environment. For example, in various embodiments, the structure(s) may be partially or entirely formed by a machine, controller, processing circuit, or some other device or combination of devices suitable for manufacturing and/or processing a thin film structure. A processing circuit may include one or more processors, chips, and/or modules implemented in hardware and/or software, and preferably having at least one hardware component, and may be utilized in any device to form one or more structures or layer thereof. Illustrative processing circuits include, but are not limited to, a central processing circuit (CPU), an application specific integrated circuit (ASIC), a field programmable gate array (FPGA), etc., combinations thereof, or any other suitable computing device known in the art.

In the descriptions of the formation of the various layers in FIGS. 5A-5F, each layer may be formed using any known deposition process, such as sputtering, plating, chemical vapor deposition (CVD), plasma chemical vapor deposition (pCVD), (PECVD), physical vapor deposition (PVD), molecular beam epitaxy (MBE), atomic layer deposition (ALD), etc. Moreover, any descriptions of removal of layers and/or material may be performed using any material removal process of a type known in the art, such as planarization, chemical mechanical polishing (CMP), recess etching, reactive ion etching (RIE), ion milling, plasma etching, photolithography, etc. Moreover, in these descriptions, low temperature refers to temperatures of less than about 200° C.

Figure 5A:
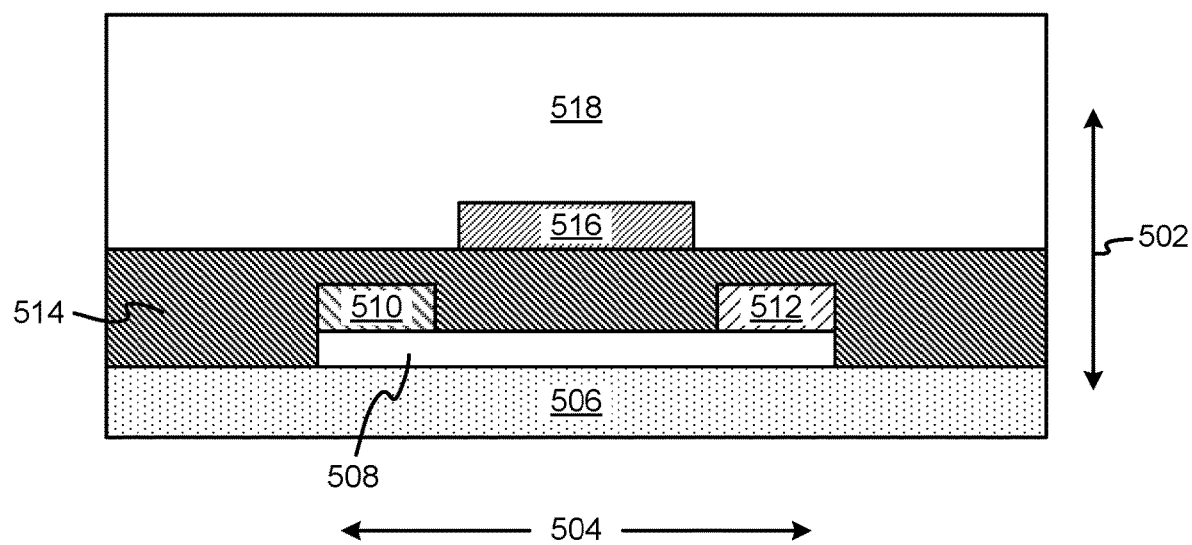
FIGS. 5A-5F show various structures created during manufacture of an acceptor structure according to one embodiment.

As shown in FIG. 5A, a flexible thin film access transistor structure is shown having a TG/TC architecture. The thin film access transistor structure is formed from a substrate 506 selected from polyimide, PEEK, PEN, transparent conductive polyester film, etc., a channel layer 508 above, in a film thickness direction 502, a central portion of the substrate 506 in an element width direction 504, a source layer 510 and a drain layer 512 above the channel layer 508 in the film thickness direction 502, separated by a gate oxide layer 514 that is formed above the substrate 506, the channel layer 508, the source layer 510, and the drain layer 512 in the film thickness direction 502. Above a central portion of the gate oxide layer 514 in the film thickness direction 502, a gate layer 516 is formed, that is electrically insulated from layers positioned therebelow by the gate oxide layer 514. The positioning of the source layer 510 and the drain layer 512 may be swapped, in another embodiment, an effect that may be visualized by observing the flexible thin film access transistor structure from a reverse perspective.

In one embodiment, extents of the gate layer 516 do not extend above either of the source layer 510 and the drain layer 512 (e.g., the gate layer 516 does not extend above the source layer 510 and the drain layer 512 in the element width direction 504). In an alternate embodiment, the extents of the gate layer 516 may extend above the source layer 510 and the drain layer 512 in the element width direction 504, and/or completely overlap with the source layer 510 and the drain layer 512.

Above the flexible thin film access transistor structure, an insulative layer 518 is formed using a suitable low temperature process. In one embodiment, low temperature oxide deposition is performed to form the insulative layer 518, such as via pCVD, also referred to as plasma-enhanced CVD (PECVD).

In another embodiment, a spin-on-glass (SOG) process may be used to form the insulative layer 518. SOG may be performed using a mixture of $SiO_2$ and dopants (B, P, or some other suitable dopant known in the art) that is suspended in a solvent solution. The SOG process applies the mixture to the flexible thin film access transistor structure by spin-coating, similar to application of photoresist, to form the insulative layer 518 by subsequent low-temperature thermal annealing and/or ultraviolet (UV) annealing.

Figure 5B:
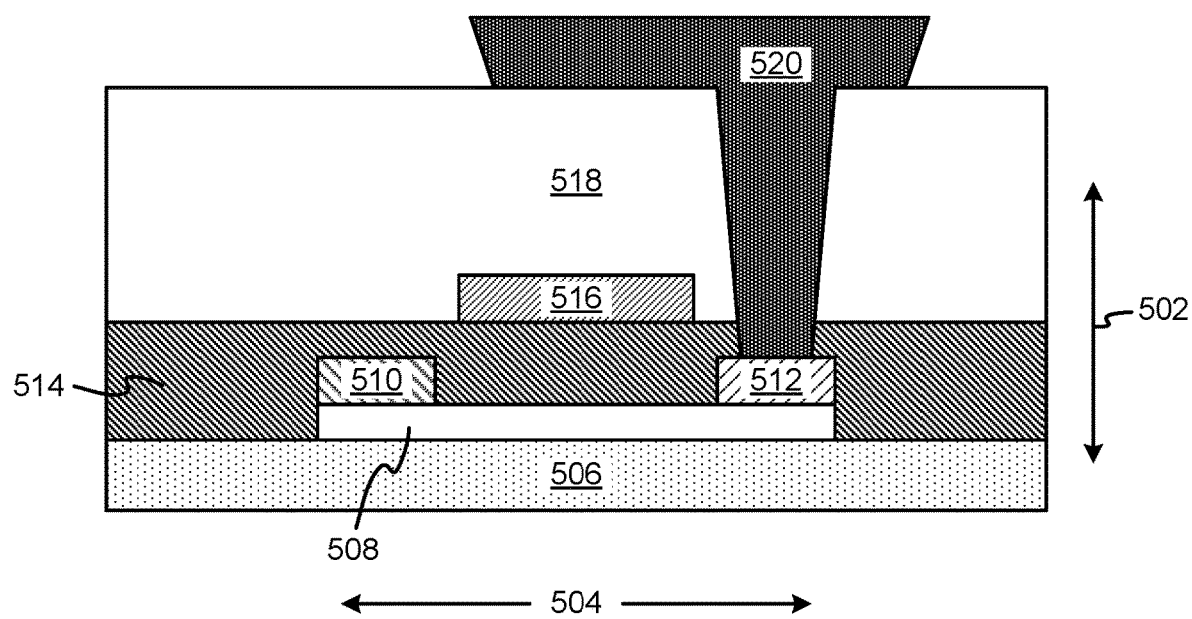

Now referring to FIG. 5B, lithography or some other suitable process known in the art is performed to create a contact hole through the insulative layer 518 and the gate oxide layer 514, which exposes a top edge of the drain layer 512. When the drain layer 512 and source layer 510 are swapped, the contact hole is formed on the other side of the structure. Gap filling deposition is performed to deposit a contact pad layer 520 in the hole and above the insulative layer 518. The contact pad layer 520 may comprise any suitable low temperature bonding conductive metal known in the art, such as Au, Ag, Ta, etc. After forming the contact pad layer 520 above the insulative layer 518, etching is performed to form the upper portion of the contact pad layer 520, restricting the surface area in the element width direction 504 and element height direction (the z-direction into the page perpendicular to the element width direction 504 and the film thickness direction 502).

Figure 5C:
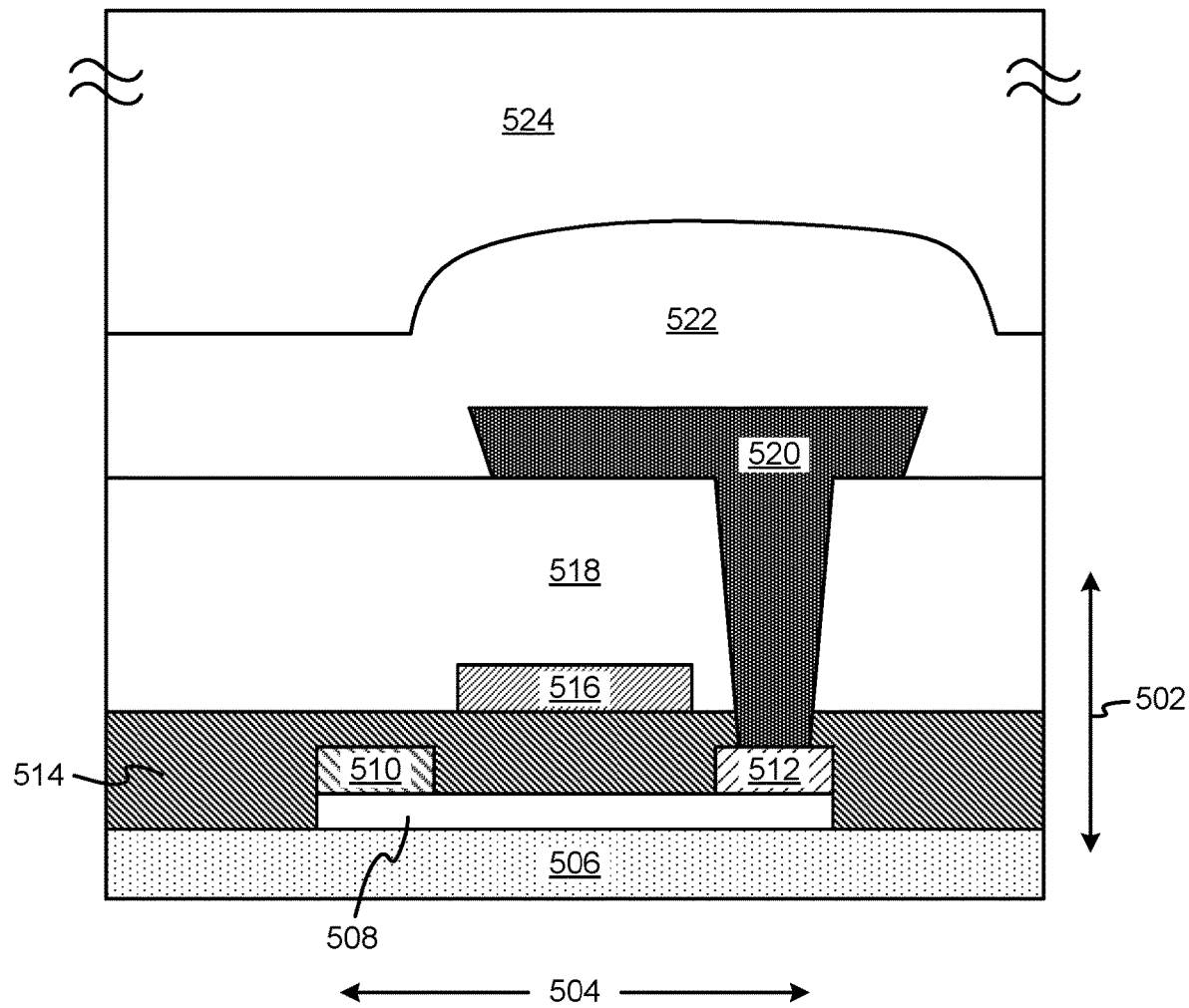

With reference to FIG. 5C, SOG is performed to form an upper insulative layer 522, and then a photoresist layer 524 is formed above the upper insulative layer 522. The upper insulative layer 522 may comprise a SOG material known in the art. The photoresist layer 524 may comprise any suitable positive or negative photoresist material known in the art, such as an allyl monomer, an azide quinone, Off-Stoichiometry Thiol-Enes (OSTE) polymers, etc. The thickness of the photoresist layer 524 in the film thickness direction 502 is much greater than shown in FIG. 5C, as indicated by the line extensions. This structure is then cured.

Figure 5D:
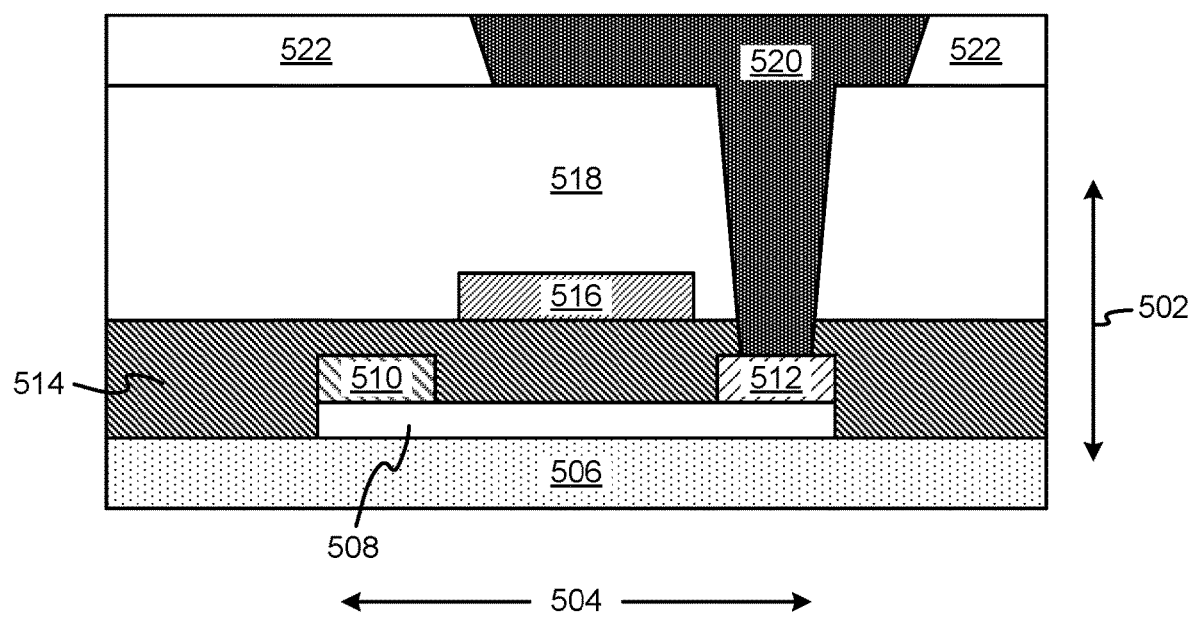

As shown in FIG. 5D, recess etching is performed (or some other suitable process) to cut back the structure to the level of the upper edge of the contact pad layer 520. The recess etching process preferably is tuned to possess 1:1 etch selectivity between the aforementioned photoresist layer 524 and the insulative layer 522 to produce a planarized surface. This structure is now ready to accept additional electrical structures thereon, while providing a flexible substrate and electrical connections for the received structures.

Figure 5E:
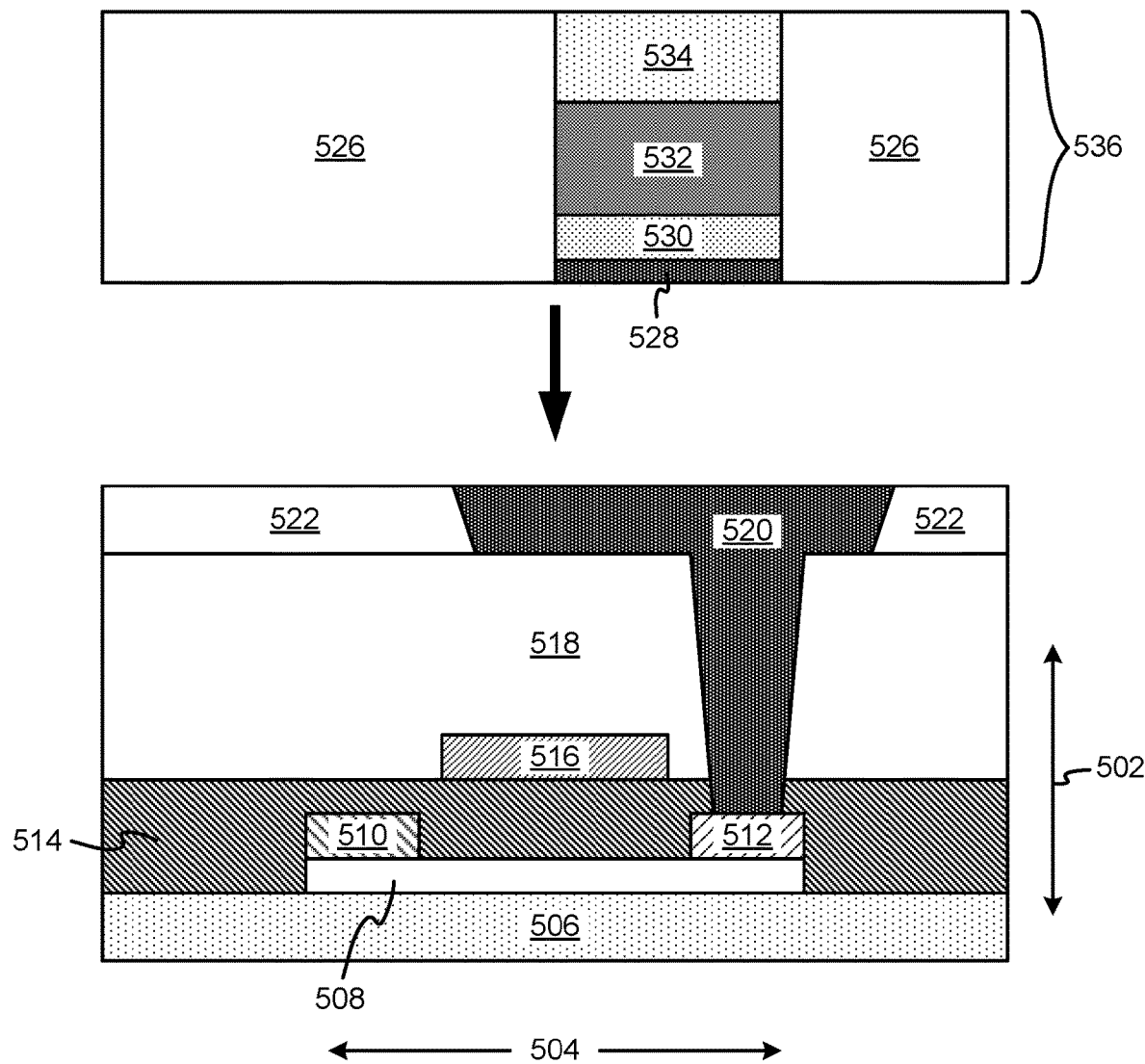

In one such embodiment, as shown in FIG. 5E, a donor structure 536 may be provided and adhered to an upper surface of the acceptor structure. The donor structure 536 may include insulative layers 526 that are positioned on sides of a stack that includes a lower adhesion layer 528, a bottom electrode layer 530, a pMTJ 532, and an upper electrode layer 534.

Figure 5F:
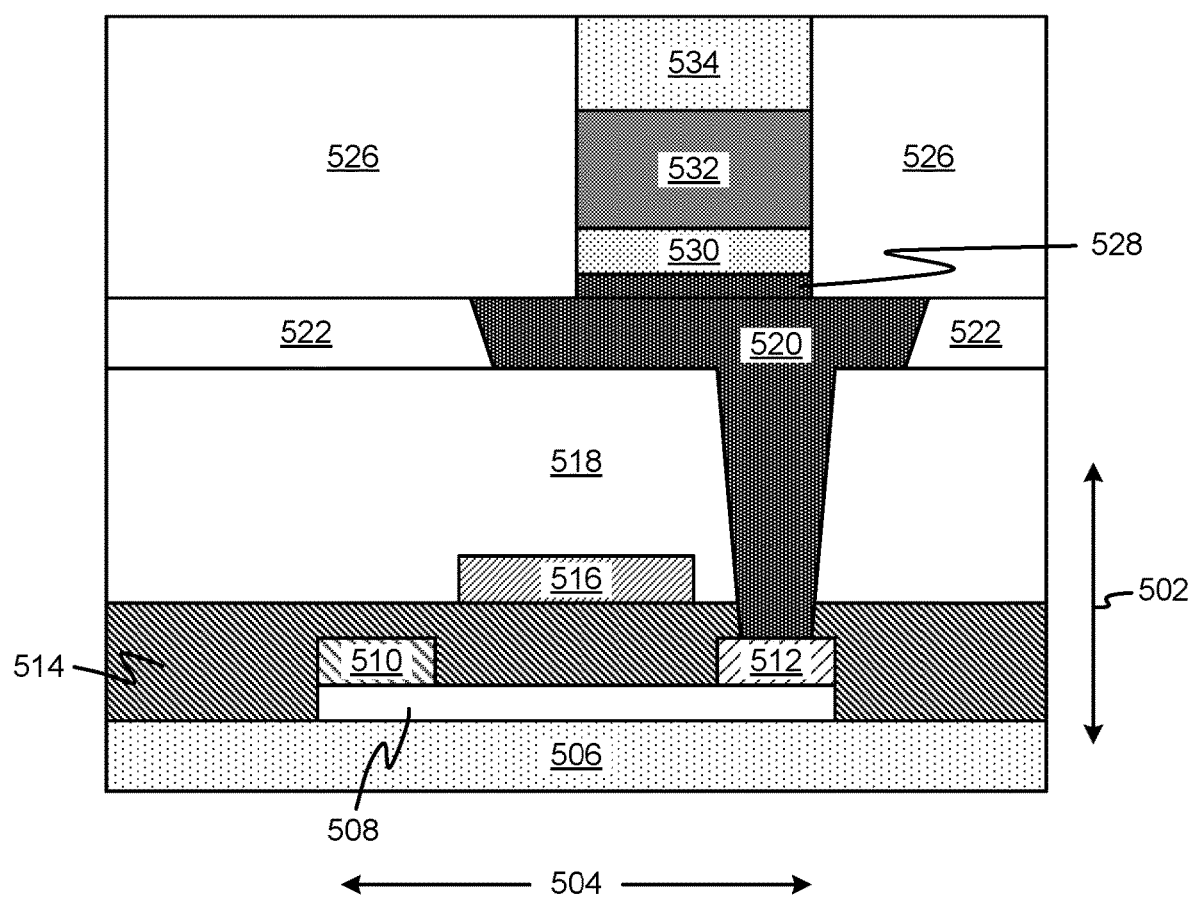

The connection between the donor structure 536 and the acceptor structure is shown in FIG. 5F, where the thin adhesion layer 528 is used to adhere the upper and lower structures together. The adhesion layer 528 may comprise Au, Ag, Ta, or some other suitable conductive adhesion material known in the art.

The size of the upper surface of the contact pad layer 520 is larger than a lower surface of the adhesion layer 528 to allow for alight placement misalignments to occur, without reducing or breaking electrical coupling between the adhesion layer 528 and the contact pad layer 520. After placement of the donor structure 536, the entire structure is annealed at low temperature, between about 160° C. and about 200° C. to bond the upper and lower portions together via the adhesion layer 528.

Each of the electrode layers 530, 534 may comprise any suitable conductive material, such as TaN, TiNi, TiN, TiW, etc. The insulative layers 526 may comprise $SiO_2$, $Al_2O_3$, $HfO_2$, combinations thereof, etc.

In one embodiment, the pMTJ 532 may comprise a seed layer, an underlayer positioned above the seed layer, a synthetic antiferromagnetic (SAF) seed layer positioned above the underlayer, a first SAF layer positioned above the SAF seed layer, a spacer layer positioned above the first SAF layer, an antiferromagnetic (AFM) coupling layer positioned above the spacer layer, a second SAF layer positioned above the AFM coupling layer, a ferromagnetic (FM) coupling layer positioned above the second SAF layer, a reference layer that comprises a first reference layer positioned below a second reference layer, a barrier layer positioned above the reference layer, a free layer which includes a lower free layer positioned above the barrier layer, a middle free layer positioned above the lower free layer, and an upper free layer positioned above the middle free layer. The pMTJ may also comprise a first cap layer positioned above the upper free layer, a second cap layer positioned above the first cap layer, a third cap layer positioned above the second cap layer, and a fourth cap layer positioned above the third cap layer.

According to one embodiment, the seed layer may be formed above a poly-crystalline layer that includes many grain boundaries, such as TaN. The seed layer may act to stop texture propagation from this poly-crystalline layer. Otherwise, the grain structure of the poly-crystalline layer may propagate upward in the structure. The seed layer may comprise Ta and/or a suitable material known in the art and may have a thickness of about 1 nm. The underlayer may be used to facilitate recrystallization of the subsequently formed SAF layers during post-pMTJ annealing. It may comprise Ru and/or a suitable material known in the art and may have a thickness of about 3 nm. The SAF seed layer may comprise Pt and/or a suitable material known in the art and may have a thickness of about 0.25 nm. It may be used to spur growth of the first SAF layer. The first SAF layer exhibits a strong perpendicular anisotropy field, and may comprise CoPt and/or a suitable material known in the art, with a thickness of about 1.5 nm. The spacer layer may comprise Co and/or a suitable material known in the art and may have a thickness of about 0.35 nm.

Moreover, for the pMTJ 532, the AFM coupling layer may comprise Ru and/or a suitable material known in the art, with a thickness of about 0.85 nm. The AFM coupling layer is positioned between the first and second SAF layers to cause the second SAF layer to have antiferromagnetic coupling with the first SAF layer. The second SAF layer may comprise Co and/or a suitable material known in the art and may have a thickness of about 0.9 nm. The FM coupling layer may comprise Mo and/or a suitable material known in the art, with a thickness of about 0.35 nm. The FM coupling layer may provide ferromagnetic-coupling between the second SAF layer and the reference layer. The first reference layer may comprise CoFeB40 and/or a suitable material known in the art, with a thickness of about 0.5 nm, while the second reference layer may comprise CoFeB30 and/or a suitable material known in the art, with a thickness of about 0.3 nm. The reference layer has different compositions along the film thickness direction. In one embodiment, a higher Fe concentration is present in the second reference layer for more spin-polarized current, while a higher Co concentration is present in the first reference layer for better coupling with the second SAF layer. The barrier layer may comprise MgO and/or a suitable material known in the art, with an average resistance area product of about RA=7. The barrier layer may be deposited using DC sputtering where metallic Mg is deposited and subsequently oxidized with oxygen in order to form MgO.

The pMTJ 532 may also utilize a wetting layer that may be positioned above the barrier layer, in one embodiment. The wetting layer is a very thin layer which causes an upper surface of the MgO of the barrier layer to become sticky, thereby prohibiting island formation during subsequent CoFeB deposition of the lower free layer. This wetting layer may be deposited at a low temperature (about 100K) and comprise a few (e.g., three to one hundred) monolayers of Fe, in one approach. The lower free layer may comprise CoFeB20 and/or a suitable material known in the art, with a thickness of about 1.4 nm. The middle free layer may comprise W and/or a suitable material known in the art, with a thickness of about 0.3 nm, and the upper free layer may comprise CoFeB20 and/or a suitable material known in the art, with a thickness of about 0.6 nm. The free layer is configured to flip magnetic orientation in the presence of spin-torque current. The W of the middle free layer blocks B diffusion through the middle free layer, while also gathering and trapping the B inside the W material.

The first cap layer of the pMTJ 532 may comprise MgO and/or a suitable material known in the art and may have an average resistance area product of about RA=1.0, the second cap layer may comprise CoFeB20 and/or a suitable material known in the art and may have a thickness of about 0.6 nm, the third cap layer may comprise Ta and/or a suitable material known in the art and may have a thickness of about 3 nm, and the fourth cap layer may comprise Ru and/or a suitable material known in the art and may have a thickness of about 10 nm. The collection of capping layers act to block metallic ion diffusion from above, and to resist pMTJ 532 metallization. Ru is widely used to electrically extend the pMTJ 532 to another electrical terminal that may be positioned and/or formed above the pMTJ 532.

Now referring to FIGS. 6A-6H, formation of a donor structure is shown according to one embodiment. The donor structure may be formed in accordance with the present invention in any of the environments depicted in FIGS. 1-4B, among others not specifically described, in various approaches. Of course, more steps, layers, and/or structures may be utilized in the formation of any of the structures and/or layers thereof than those specifically described in FIGS. 6A-6H, as would be understood by one of skill in the art upon reading the present descriptions.

Each of the intermediate structures shown in FIGS. 6A-6H may be formed by any suitable component of the operating environment. For example, in various embodiments, the structure(s) may be partially or entirely formed by a machine, controller, processing circuit, or some other device or combination of devices suitable for manufacturing and/or processing a thin film structure. A processing circuit may include one or more processors, chips, and/or modules implemented in hardware and/or software, and preferably having at least one hardware component, and may be utilized in any device to form one or more structures or layer thereof. Illustrative processing circuits include, but are not limited to, a CPU, an ASIC, a FPGA, etc., combinations thereof, or any other suitable computing device known in the art.

In the descriptions of FIGS. 6A-6H, each layer may be formed using any known deposition process, such as sputtering, plating, CVD, pCVD, PVD, MBE, ALD, etc. Moreover, any descriptions of removal of layers and/or material may be performed using any material removal process of a type known in the art, such as planarization, CMP, recess etching, RIE, ion milling, plasma etching, photolithography, etc.

Figure 6A:
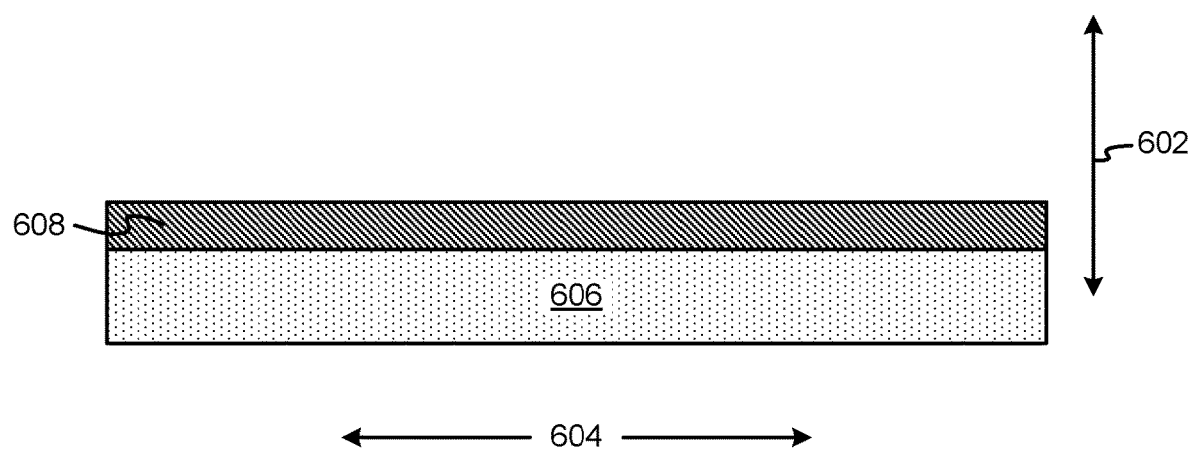
FIGS. 6A-6H show various structures created during manufacture of a donor structure, in one embodiment.

As shown in FIG. 6A, a substrate 606 is provided, which may be a conventionally or commercially available silicon substrate, and then a sacrificial buried layer 608 is formed thereon in the film thickness direction 602. The sacrificial buried layer 608 may be grown or deposited, and preferably will have a final thickness of about 50 nm to about 100 nm, such as about 80 nm in some approaches. The sacrificial buried layer 608 may comprise any suitable nitride material known in the art, such as SiN, SiGe, amorphous silicon (α-Si), etc.

Figure 6B:
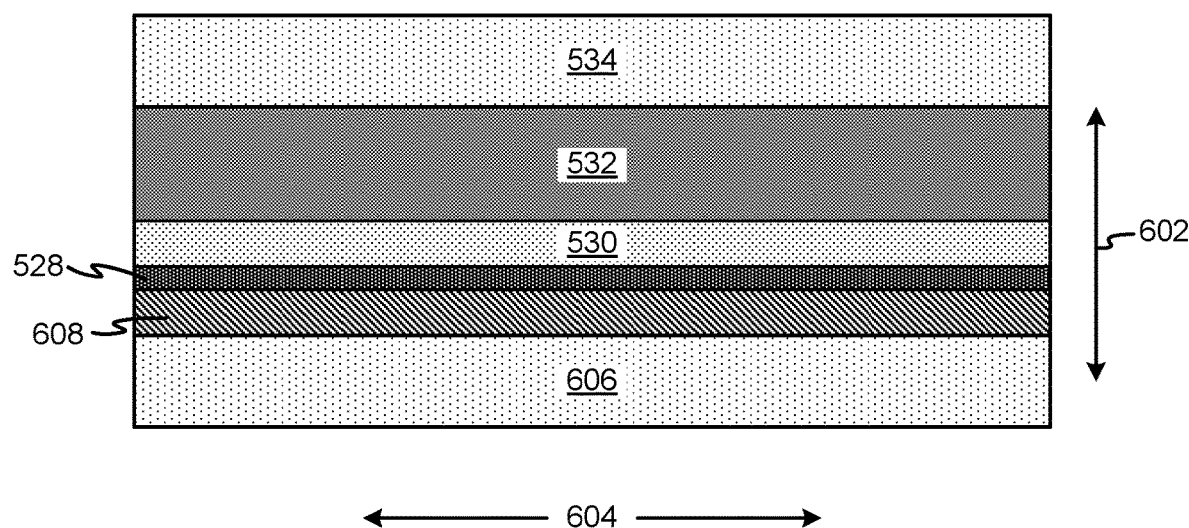

In FIG. 6B, a lower adhesion layer 528, a bottom electrode layer 530, a pMTJ 532, and an upper electrode layer 534 are formed above the sacrificial buried layer 608 in the film thickness direction 602. The lower adhesion layer 528 is used to adhere the donor structure to an acceptor structure. The lower adhesion layer 528 may comprise Au, Ag, Ta, or some other suitable conductive adhesion material known in the art. The lower and upper electrode layers 530, 534 may comprise any suitable conductive material known in the art, such as TaN, TiNi, TiN, TiW, etc.

Figure 6C:
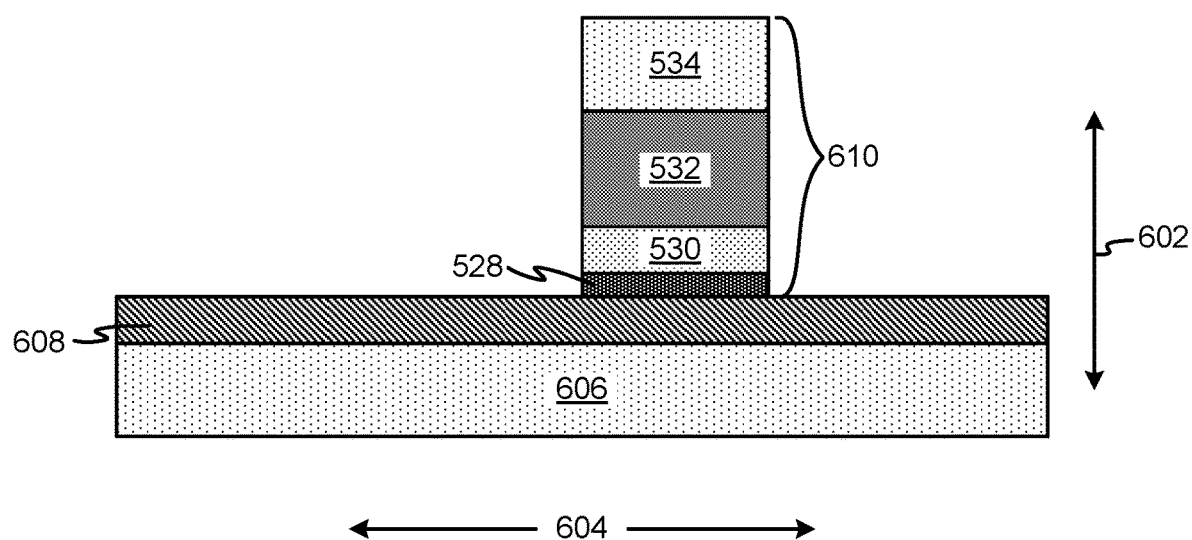

As shown in FIG. 6C, hardmask patterning is performed to form a stack 610 (or pillar) structure to a desired width in the element width direction 604. In one embodiment, oxide deposition may be performed, followed by oxide patterning prior to utilizing the upper electrode layer 534 as a hardmask to remove the layers therebelow down to the sacrificial buried layer 608.

Figure 6D:
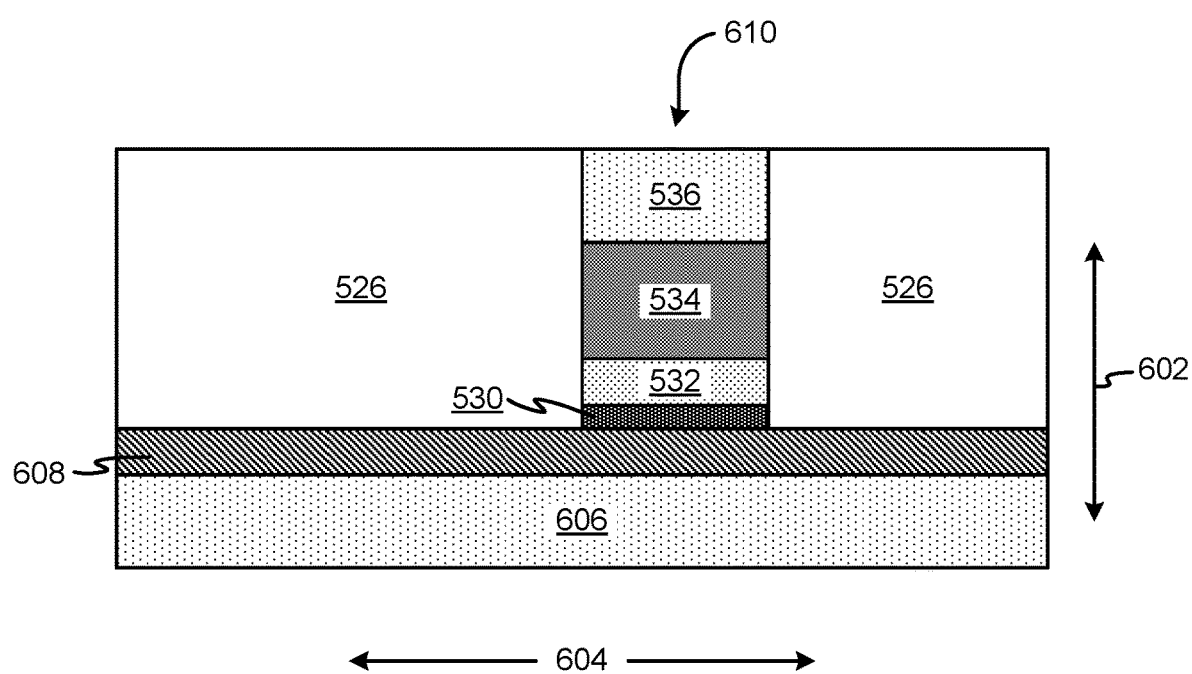

In FIG. 6D, insulative layers 526 are formed on sides of the stack 610 in the element width direction 604, which may comprise any suitable insulative material known in the art, such as $SiO_2$, $Al_2O_3$, $HfO_2$, combinations thereof, etc. Planarization and/or some other removal process may be used to match the thickness of the insulative layers 526 to that of the stack 610.

Figure 6E:
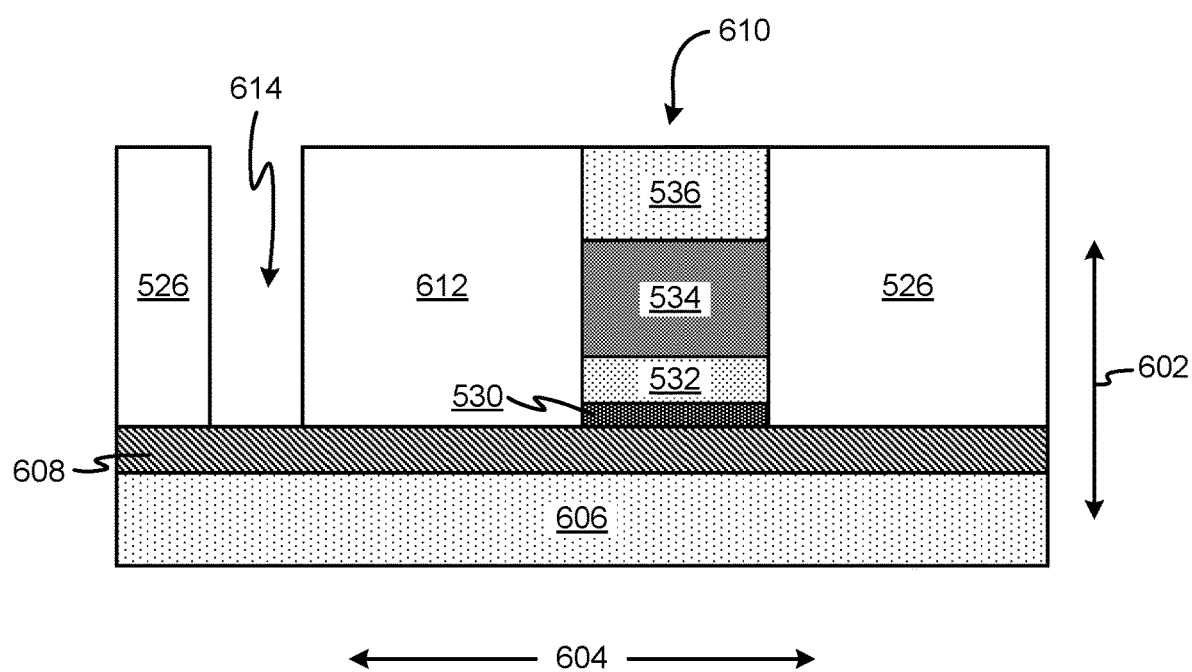

In a further embodiment, a channel 614 is formed through the insulative layer 526, as shown in FIG. 6E. The channel 614 is separated from a side of the stack 610 by a portion of the remaining insulative layer 612, which controls the distance between the channel 614 and the stack 610. The channel 614 may be formed via lithography using photoresist, or some other suitable targeted removal process known in the art.

Figure 6F:
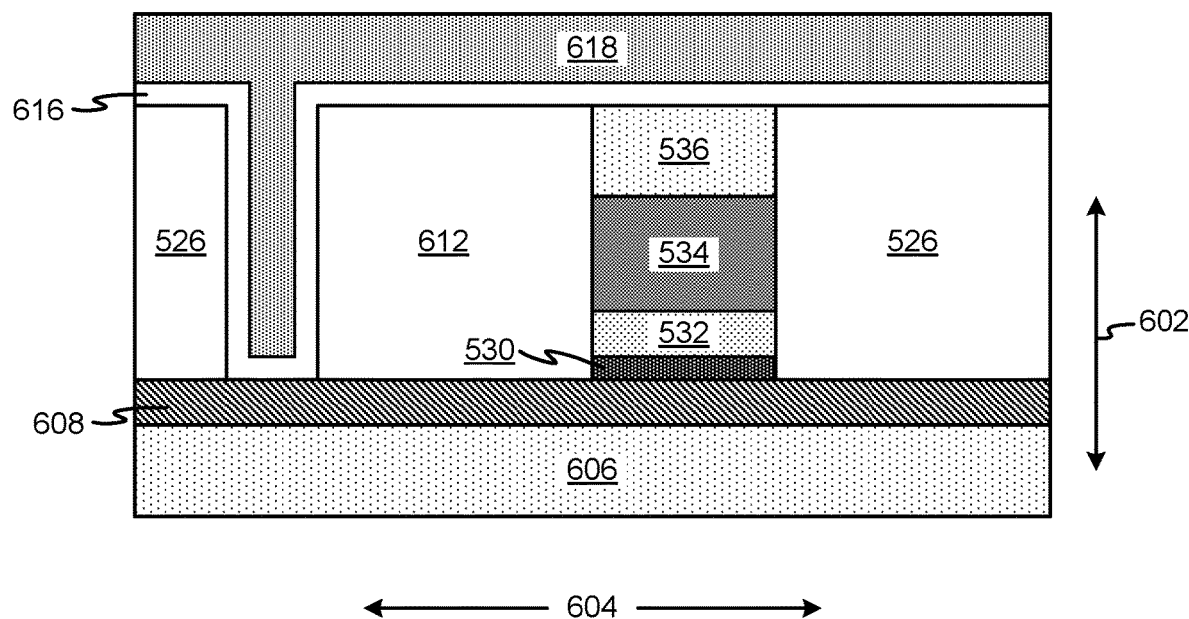

Continuing in this further embodiment, in FIG. 6F, formation of an upper adhesion layer 616 is shown, along with deposition of a bit line layer 618 thereon. The upper adhesion layer 616 is a thin film that enables low temperature bonding between the bit line layer 618 and the rest of the structure, through the channel. The upper adhesion layer 616 may comprise Au, Ag, Ta, or some other suitable conductive adhesion material known in the art. The bit line layer 618 may comprise any suitable conductive material known in the art, such as W, TaN, TiNi, TiN, TiW, etc.

Figure 6G:
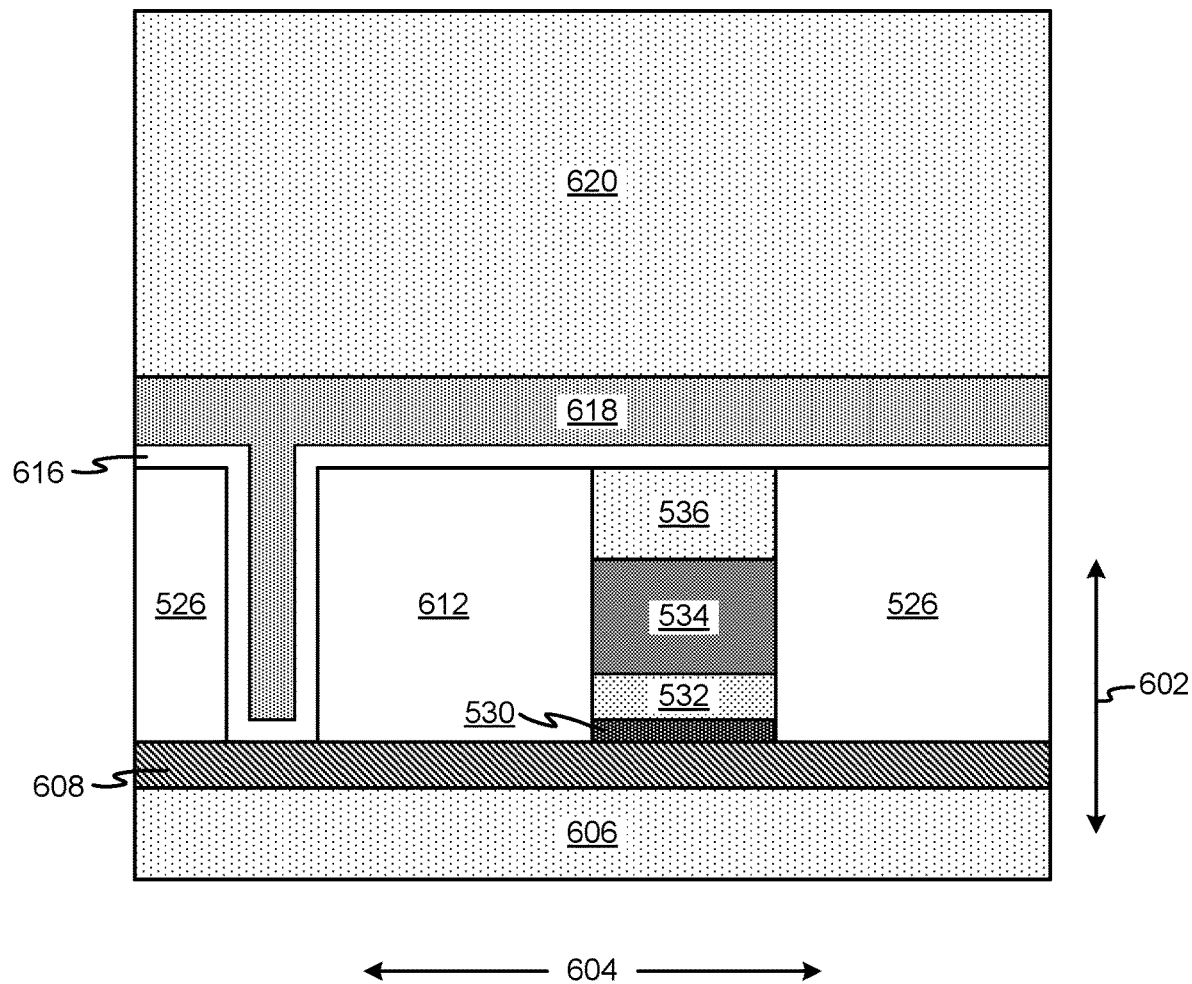
Figure 6H:
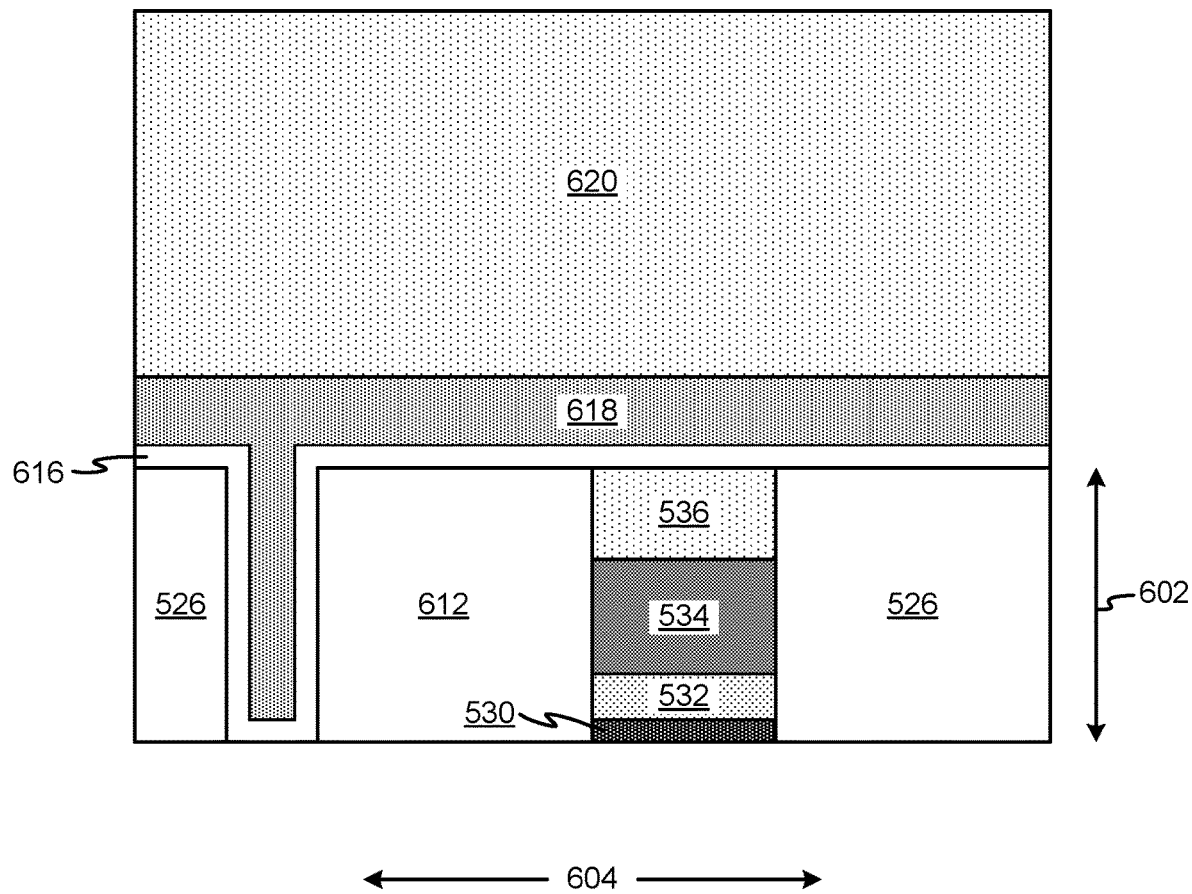

As shown in FIG. 6G, a large lift layer 620 is introduced to the structure, which adheres to the structure upon contact therewith, to enable the structure to be lifted. In one embodiment, the lift layer 620 may comprise polydimethylsiloxane (PDMS) or some other suitable layer capable of adhering to the structure through simple contact therewith. After adhering the lift layer 620, the sacrificial buried layer 608 is etched away, using concentrated hot phosphoric acid ($H_3PO_4$) or some other suitable etching liquid depending on the type of sacrificial buried layer being used or gas that attacks the material of the sacrificial buried layer 608, to detach that substrate 606 from the remainder of the structure to allow placement on an acceptor structure. This results in the donor structure shown in FIG. 6H, which may be placed on an acceptor structure, such as shown in FIGS. 5E-5F, in one embodiment. After placement of the donor structure, the lift layer 620 of FIG. 6H is detached from the remainder of the donor structure, allowing access to the bit line layer 618 therebelow.

Figure 7:
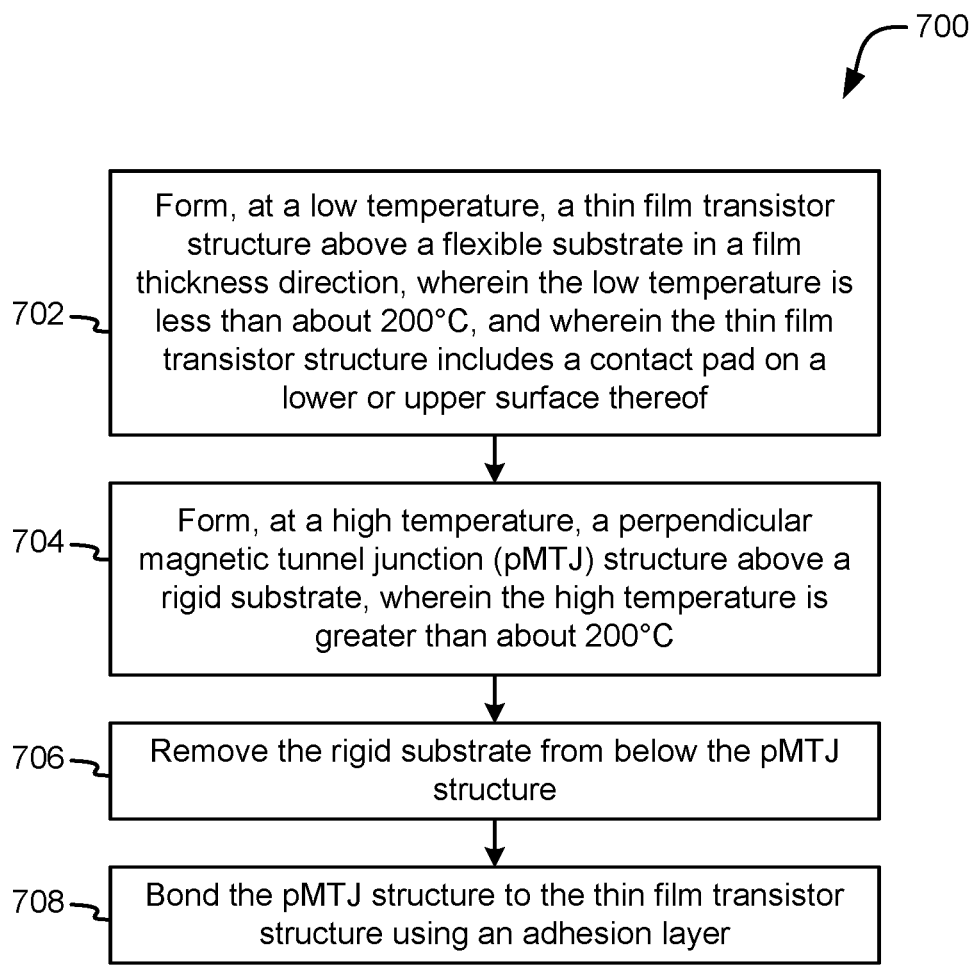
FIG. 7 is a flowchart of a method, in accordance with one embodiment.

Now referring to FIG. 7, a method 700 is shown according to one embodiment. The method 700 may be performed in accordance with the present invention in any of the environments depicted in FIGS. 1-6H, among others not specifically described, in various approaches. Of course, more or less operations than those specifically described in FIG. 7 may be included in method 700, as would be understood by one of skill in the art upon reading the present descriptions.

Each of the operations of method 700 may be performed by any suitable component of the operating environment. For example, in various embodiments, method 700 may be partially or entirely performed by a machine, controller, processing circuit, or some other device or combination of devices suitable for manufacturing and/or processing a thin film structure. A processing circuit may include one or more processors, chips, and/or modules implemented in hardware and/or software, and preferably having at least one hardware component, and may be utilized in any device to perform one or more operations of method 700. Illustrative processing circuits include, but are not limited to, a CPU, an ASIC, a FPGA, etc., combinations thereof, or any other suitable computing device known in the art.

In the descriptions of method 700 in FIG. 7, each layer may be formed using any known deposition process, such as sputtering, plating, CVD, pCVD, PVD, MBE, ALD, etc. Moreover, any descriptions of removal of layers and/or material may be performed using any material removal process of a type known in the art, such as planarization, CMP, recess etching, RIE, ion milling, plasma etching, photolithography, etc.

Method 700 may begin with operation 702. In operation 702, a thin film transistor structure is formed, at low temperature, above a flexible substrate in a film thickness direction.

The low temperature is less than about 200° C., and the thin film transistor structure includes a contact pad on a lower or upper surface thereof, for coupling the thin film transistor structure to another structure, such as a pMTJ structure.

In one embodiment, the thin film transistor structure may utilize a BG/BC architecture. In this embodiment, the thin film transistor structure is manufactured by forming a gate layer above the flexible substrate, forming a gate oxide layer above the gate layer and exposed portions of the flexible substrate in a film thickness direction, the gate oxide layer electrically insulating the gate layer from layers formed thereabove, forming a source layer and a drain layer above the gate oxide layer in the film thickness direction, and forming a channel layer above the source layer, the drain layer, and an exposed portion of the gate oxide layer that is not covered by the source layer or the drain layer in the film thickness direction. The source layer is separated from the drain layer by a portion of the channel layer. Moreover, in this embodiment, a contact pad may be formed on a bottom surface of the structure for electrically coupling to another structure.

In another embodiment, the thin film transistor structure may utilize a BG/TC architecture. In this embodiment, the thin film transistor structure is manufactured by forming a gate layer above the flexible substrate in a film thickness direction, forming a gate oxide layer above the gate layer and exposed portions of the flexible substrate that are not covered by the gate layer in the film thickness direction, the gate oxide layer electrically insulating the gate layer from layers formed thereabove, forming a channel layer above the gate oxide layer in the film thickness direction, forming a source layer and a drain layer above the channel layer in the film thickness direction, forming an insulative layer above the source layer, the drain layer, and exposed portions of the channel layer in the film thickness direction, wherein the source layer is separated from the drain layer by a portion of the insulative layer, removing a portion of the insulative layer that is positioned above the drain layer to form a contact hole, the contact hole exposing a top edge of the drain layer, and forming a contact pad layer in the contact hole and above a portion of the insulative layer. The contact pad includes a low temperature bonding conductive material. Moreover, an upper portion of the contact pad layer extends beyond extents of the drain layer in the element thickness direction perpendicular to the film thickness direction.

In another embodiment, the thin film transistor structure may utilize a TG/BC architecture. In this embodiment, the thin film transistor structure is manufactured by forming a source layer and a drain layer above the flexible substrate in the film thickness direction, forming a channel layer above the source layer, the drain layer, and a portion of the flexible substrate between the source layer and the drain layer in the film thickness direction, with the source layer being separated from the drain layer by a portion of the channel layer, forming a gate oxide layer above the gate layer and exposed portions of the flexible substrate that are not covered by the gate layer in the film thickness direction, and forming a gate layer above the gate oxide layer in the film thickness direction. The gate layer is electrically insulated from layers formed therebelow by the gate oxide layer. Moreover, in this embodiment, a contact pad may be formed on a bottom surface of the structure for electrically coupling to another structure.

In another embodiment, the thin film transistor structure may utilize a BG/TC architecture. In this embodiment, the thin film transistor structure is manufactured by forming a channel layer above a portion of the flexible substrate in the film thickness direction, forming a source layer and a drain layer above the channel layer in the film thickness direction, forming a gate oxide layer above the source layer, the drain layer, a portion of the channel layer between the source layer and the drain layer, and exposed portions of the substrate not covered by the channel layer in the film thickness direction, with the source layer being separated from the drain layer by a portion of the gate oxide layer, forming a gate layer above the gate oxide layer in the film thickness direction, with the gate layer being electrically insulated from layers formed therebelow by the gate oxide layer, forming an insulative layer above the gate layer and exposed portions of the gate oxide layer in the film thickness direction, removing portions of the insulative layer and the gate oxide layer that is positioned above the drain layer to form a contact hole, the contact hole exposing a top edge of the drain layer, and forming a contact pad layer in the contact hole and above a portion of the insulative layer, the contact pad including a low temperature bonding conductive material. Moreover, an upper portion of the contact pad layer extends beyond extents of the drain layer in the element thickness direction perpendicular to the film thickness direction.

In any of these embodiments (e.g., TG/BC, TG/TC, BG/TC, BG/BC), the flexible substrate may include polyimide, PEEK, PEN, transparent conductive polyester film, etc., the gate layer may include doped polysilicon, W, TaN, TiNi, TiN, etc., the gate oxide layer may include a dielectric like $SiO_2$, $Al_2O_3$, —$HfO_2$, etc., the source layer and the drain layer may each comprise Pt, Jr, Pd, Au, Ti, Ta, Cu, ITO, and/or similar suitable materials known in the art which are able to form ohmic or low-barrier Schottky contact with doped regions of the channel layer. The channel layer may comprise $ZnO_2$, InZnO, InGaZnO, pentacene, P3HT, PTAA, similar suitable materials known in the art, and/or combinations thereof. The channel layer may also be fully or partially doped (such as in regions that contact the source layer and/or the drain layer), such as with oxygen vacancies, Al, P, As, N, etc. Oxygen vacancies and traps are also regarded as dopants for organic thin film channel materials, such as P3HT, PTAA, and pentacene. Moreover, the contact pad layer may include a low temperature bonding conductive metal like Au, Ag, Ta, etc.

In operation 704, a pMTJ structure is formed, at a high temperature, above a rigid substrate. The high temperature is greater than about 200° C. In some embodiments, the pMTJ structure includes a contact pad on an upper surface, a lower surface, or both surfaces, for coupling to another structure or structures.

The pMTJ structure may be manufactured by forming a sacrificial buried layer above the rigid substrate in the film thickness direction, forming the adhesion layer above the sacrificial buried layer in the film thickness direction, forming a bottom electrode layer above the adhesion layer in the film thickness direction, forming a pMTJ above the bottom electrode layer in the film thickness direction, forming an upper electrode layer above the pMTJ in the film thickness direction, patterning the adhesion layer, the bottom electrode, the pMTJ, and the upper electrode layer to form a pillar via a material removal process, forming a second insulative layer around the pillar to an upper extent of the upper electrode layer in the film thickness direction, forming a channel through the second insulative layer that is separated from a side of the pillar by a portion of the second insulative layer, and forming a bit line layer above the second insulative layer, an exposed portion of the sacrificial buried layer and the upper electrode layer, and along sides of the channel.

In this embodiment, the sacrificial buried layer may have a thickness of about 50 nm to about 100 nm and may include SiN, AlN, TiN, etc. Moreover, the bit line layer may include W, TaN, TiNi, TiN, TiW, etc.

In operation 706, the rigid substrate is removed from below the pMTJ structure. Any technique for removing structures may be used, as would be known in the art.

In one embodiment, removing the rigid substrate from below the pMTJ structure may include adhering a lift layer to an upper surface of a bit line layer positioned above the pMTJ structure, the lift layer including PDMS or some other suitable material known in the art, and etching, using concentrated hot phosphoric acid ($H_3PO_4$), a sacrificial buried layer located below the pMTJ structure and above the rigid substrate to release the pMTJ structure from the rigid substrate. Some other liquid or gas may be used in the etching that reacts with the sacrificial buried layer to cause it to deteriorate and release from other structures.

In operation 708, the pMTJ structure is bonded, at the low temperature, to the thin film transistor structure using an adhesion layer. This bonding may be accomplished using an adhesion layer that includes a low temperature conductive metal bonding material, such as Au, Ag, Ta, etc.

Figure 8:
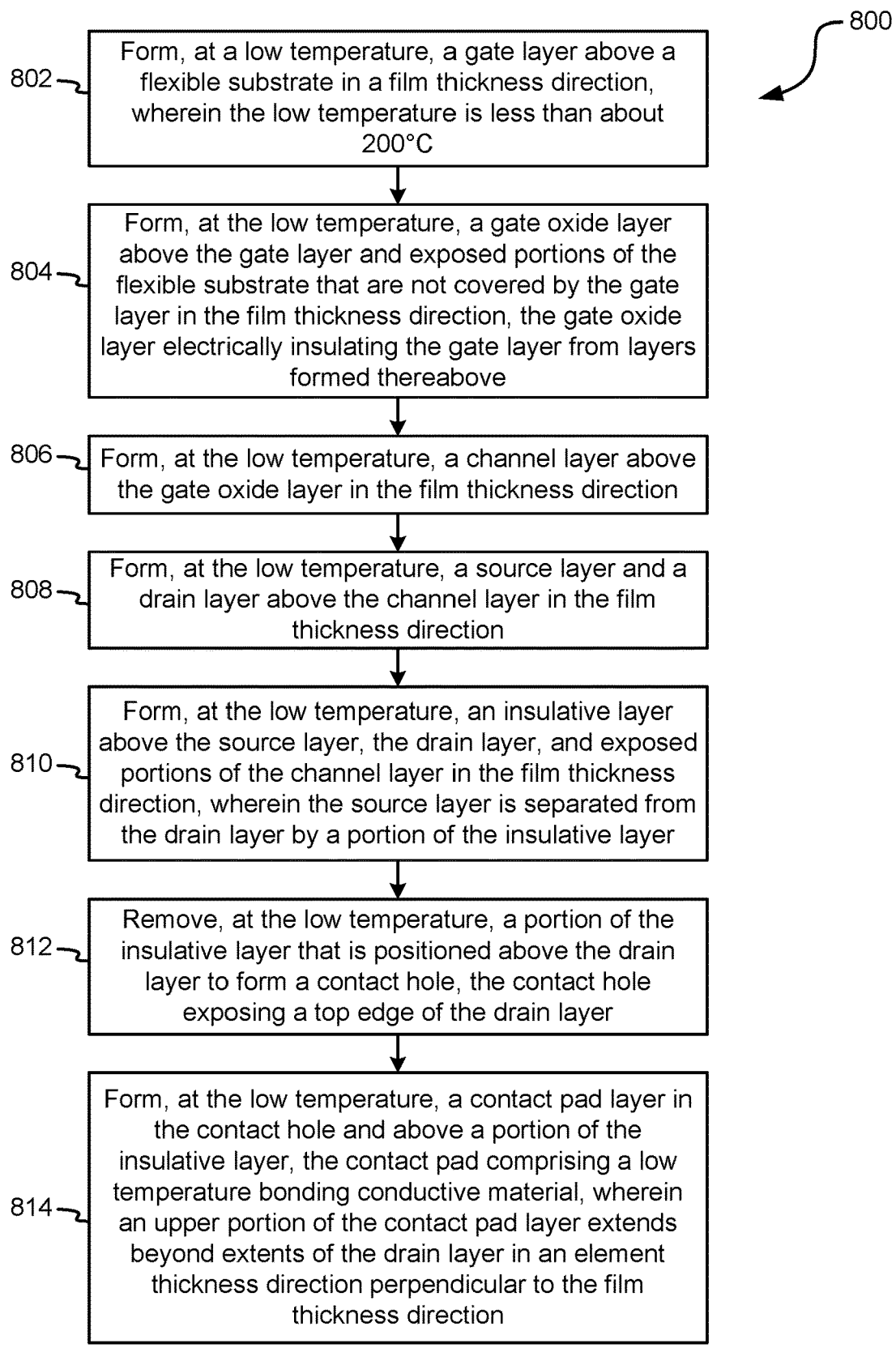
FIG. 8 shows a flowchart of another method, in accordance with one embodiment.

Now referring to FIG. 8, a method 800 is shown according to one embodiment. Method 800 may be performed in accordance with the present invention in any of the environments depicted in FIGS. 1-6H, among others not specifically described, in various approaches. Of course, more or less operations than those specifically described in FIG.

8 may be included in method 800, as would be understood by one of skill in the art upon reading the present descriptions.

Each of the operations of method 800 may be performed by any suitable component of the operating environment. For example, in various embodiments, method 800 may be partially or entirely performed by a machine, controller, processing circuit, or some other device or combination of devices suitable for manufacturing and/or processing a thin film structure. A processing circuit may include one or more processors, chips, and/or modules implemented in hardware and/or software, and preferably having at least one hardware component, and may be utilized in any device to perform one or more operations of method 800. Illustrative processing circuits include, but are not limited to, a CPU, an ASIC, a FPGA, etc., combinations thereof, or any other suitable computing device known in the art.

In the descriptions of method 800 in FIG. 8, each layer may be formed using any known deposition process, such as sputtering, plating, CVD, pCVD, PVD, MBE, ALD, etc. Moreover, any descriptions of removal of layers and/or material may be performed using any material removal process of a type known in the art, such as planarization, CMP, recess etching, RIE, ion milling, plasma etching, photolithography, etc.

Method 800 may begin with operation 802. In operation 802, a gate layer is formed, at low temperature, above a flexible substrate in a film thickness direction. The low temperature is less than about 200° C.

In operation 804, a gate oxide layer is formed, at the low temperature, above the gate layer and exposed portions of the flexible substrate that are not covered by the gate layer in the film thickness direction, the gate oxide layer electrically insulating the gate layer from layers formed thereabove.

In operation 806, a channel layer is formed, at the low temperature, above the gate oxide layer in the film thickness direction.

In operation 808, a source layer and a drain layer are formed, at the low temperature, above the channel layer in the film thickness direction.

In operation 810, an insulative layer is formed, at the low temperature, above the source layer, the drain layer, and exposed portions of the channel layer in the film thickness direction. The source layer is separated from the drain layer by a portion of the insulative layer.

In operation 812, a portion of the insulative layer that is positioned above the drain layer is removed, at the low temperature, to form a contact hole, the contact hole exposing a top edge of the drain layer.

In operation 814, a contact pad layer is formed, at the low temperature, in the contact hole and above a portion of the insulative layer, the contact pad including a low temperature bonding conductive material like Au, Ag, Ta, etc. An upper portion of the contact pad layer extends beyond extents of the drain layer in an element thickness direction perpendicular to the film thickness direction.

Figure 9:
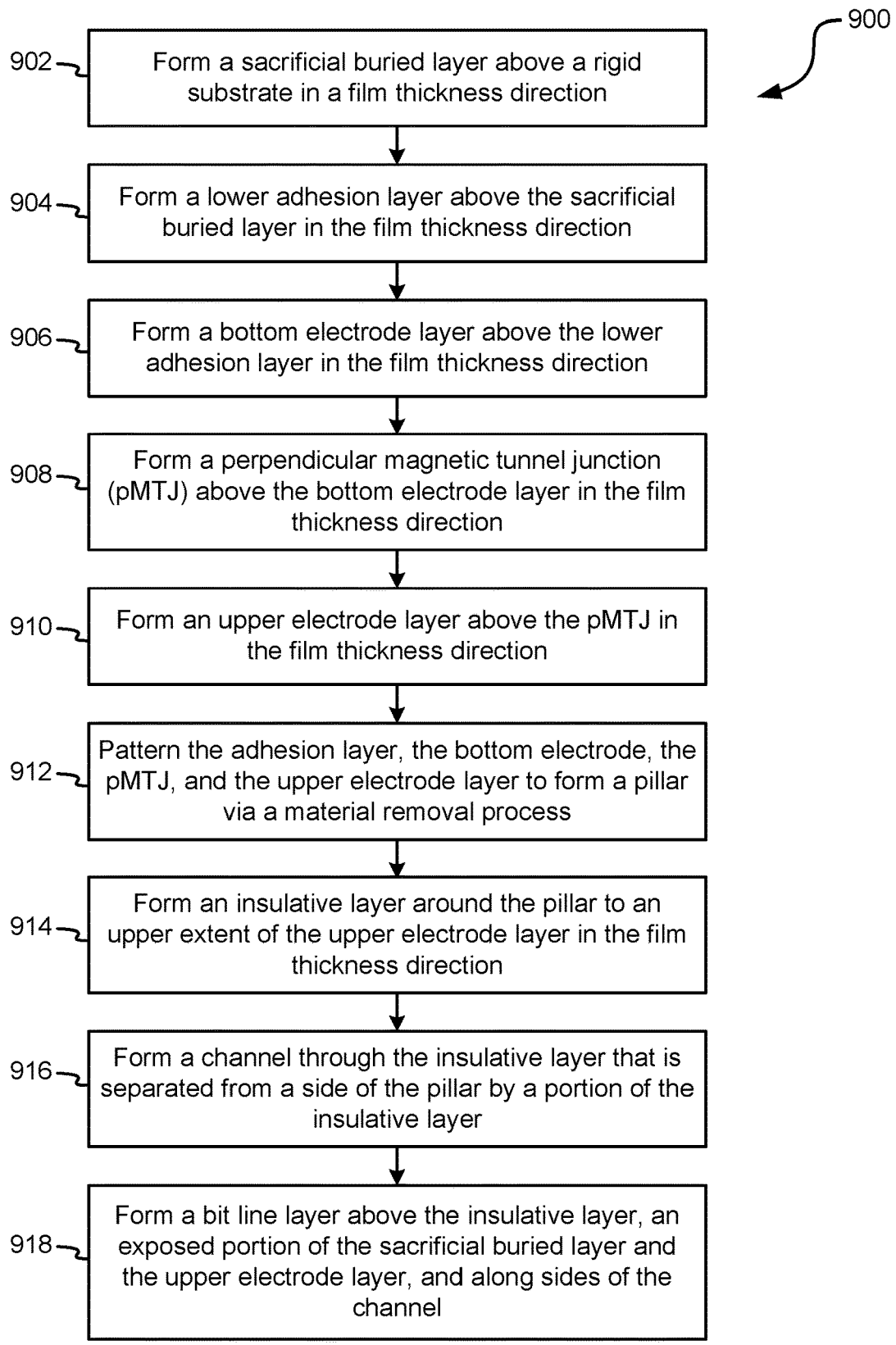
FIG. 9 shows a flowchart of a method, in accordance with another embodiment.

With reference to FIG. 9, a method 900 is shown according to one embodiment. Method 900 may be performed in accordance with the present invention in any of the environments depicted in FIGS. 1-6H, among others not specifically described, in various approaches. Of course, more or less operations than those specifically described in FIG. 9 may be included in method 900, as would be understood by one of skill in the art upon reading the present descriptions.

Each of the operations of method 900 may be performed by any suitable component of the operating environment. For example, in various embodiments, method 900 may be partially or entirely performed by a machine, controller, processing circuit, or some other device or combination of devices suitable for manufacturing and/or processing a thin film structure. A processing circuit may include one or more processors, chips, and/or modules implemented in hardware and/or software, and preferably having at least one hardware component, and may be utilized in any device to perform one or more operations of method 900. Illustrative processing circuits include, but are not limited to, a CPU, an ASIC, a FPGA, etc., combinations thereof, or any other suitable computing device known in the art.

In the descriptions of method 900 in FIG. 9, each layer may be formed using any known deposition process, such as sputtering, plating, CVD, pCVD, PVD, MBE, ALD, etc. Moreover, any descriptions of removal of layers and/or material may be performed using any material removal process of a type known in the art, such as planarization, CMP, recess etching, RIE, ion milling, plasma etching, photolithography, etc.

Method 900 may begin with operation 902. In operation 902, a sacrificial buried layer is formed above a rigid substrate in the film thickness direction. In operation 904, a lower adhesion layer is formed above the sacrificial buried layer in the film thickness direction. In operation 906, a bottom electrode layer is formed above the lower adhesion layer in the film thickness direction.

In operation 908, a pMTJ is formed above the bottom electrode layer in the film thickness direction. In operation 910, an upper electrode layer is formed above the pMTJ in the film thickness direction. In operation 912, the adhesion layer, the bottom electrode, the pMTJ, and the upper electrode layer are patterned to form a pillar via a material removal process.

In operation 914, an insulative layer is formed around the pillar to an upper extent of the upper electrode layer in the film thickness direction. In operation 916, a channel is formed through the insulative layer that is separated from a side of the pillar by a portion of the insulative layer. In operation 918, a bit line layer is formed above the insulative layer, an exposed portion of the sacrificial buried layer and the upper electrode layer, and along sides of the channel.

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A method, comprising:
    forming, at a low temperature, a thin film transistor structure above a flexible substrate in a film thickness direction, wherein the low temperature is less than about 200° C., and wherein the thin film transistor structure includes a contact pad on a lower or upper surface thereof;
    forming, at a high temperature, a perpendicular magnetic tunnel junction (pMTJ) structure above a rigid substrate, wherein the high temperature is greater than about 200° C.;
    removing the rigid substrate from below the pMTJ structure; and bonding, at the low temperature, the pMTJ structure to the thin film transistor structure using an adhesion layer.

2. The method as recited in claim 1, wherein the thin film transistor structure utilizes a bottom gate/bottom contact architecture, and wherein forming the thin film transistor structure comprises:
forming a gate layer above the flexible substrate;
forming a gate oxide layer above the gate layer and exposed portions of the flexible substrate in a film thickness direction, the gate oxide layer electrically insulating the gate layer from layers formed thereabove;
forming a source layer and a drain layer above the gate oxide layer in the film thickness direction; and
forming a channel layer above the source layer, the drain layer, and an exposed portion of the gate oxide layer that is not covered by the source layer or the drain layer in the film thickness direction,
wherein the source layer is separated from the drain layer by a portion of the channel layer.

3. The method as recited in claim 1, wherein the thin film transistor structure utilizes a bottom gate/top contact architecture, and wherein forming the thin film transistor structure comprises:
forming a gate layer above the flexible substrate in a film thickness direction;
forming a gate oxide layer above the gate layer and exposed portions of the flexible substrate that are not covered by the gate layer in the film thickness direction, the gate oxide layer electrically insulating the gate layer from layers formed thereabove;
forming a channel layer above the gate oxide layer in the film thickness direction;
forming a source layer and a drain layer above the channel layer in the film thickness direction;
forming an insulative layer above the source layer, the drain layer, and exposed portions of the channel layer in the film thickness direction, wherein the source layer is separated from the drain layer by a portion of the insulative layer;
removing a portion of the insulative layer that is positioned above the drain layer to form a contact hole, the contact hole exposing a top edge of the drain layer; and
forming a contact pad layer in the contact hole and above a portion of the insulative layer, the contact pad comprising a low temperature bonding conductive material, wherein an upper portion of the contact pad layer extends beyond extents of the drain layer in an element thickness direction perpendicular to the film thickness direction.

4. The method as recited in claim 1, wherein the thin film transistor structure utilizes a top gate/bottom contact architecture, and wherein forming the thin film transistor structure comprises:
forming a source layer and a drain layer above the flexible substrate in a film thickness direction;
forming a channel layer above the source layer, the drain layer, and a portion of the flexible substrate between the source layer and the drain layer in the film thickness direction, wherein the source layer is separated from the drain layer by a portion of the channel layer;
forming a gate oxide layer above the gate layer and exposed portions of the flexible substrate that are not covered by the gate layer in the film thickness direction; and forming a gate layer above the gate oxide layer in the film thickness direction, wherein the gate layer is electrically insulated from layers formed therebelow by the gate oxide layer.

5. The method as recited in claim 1, wherein the thin film transistor structure utilizes a top gate/top contact architecture, and wherein forming the thin film transistor structure comprises:
forming a channel layer above a portion of the flexible substrate in a film thickness direction;
forming a source layer and a drain layer above the channel layer in the film thickness direction;
forming a gate oxide layer above the source layer, the drain layer, a portion of the channel layer between the source layer and the drain layer, and exposed portions of the substrate not covered by the channel layer in the film thickness direction, wherein the source layer is separated from the drain layer by a portion of the gate oxide layer;
forming a gate layer above the gate oxide layer in the film thickness direction, wherein the gate layer is electrically insulated from layers formed therebelow by the gate oxide layer;
forming an insulative layer above the gate layer and exposed portions of the gate oxide layer in the film thickness direction;
removing portions of the insulative layer and the gate oxide layer that is positioned above the drain layer to form a contact hole, the contact hole exposing a top edge of the drain layer; and
forming a contact pad layer in the contact hole and above a portion of the insulative layer, the contact pad comprising a low temperature bonding conductive material, wherein an upper portion of the contact pad layer extends beyond extents of the drain layer in an element thickness direction perpendicular to the film thickness direction.

6. The method as recited in claim 5,
wherein the flexible substrate comprises at least one material selected from a group consisting of: polyimide, polyether ether ketone (PEEK), polyethylene naphthalate (PEN), and transparent conductive polyester film,
wherein the gate layer comprises at least one material selected from a group consisting of: doped polysilicon, W, TaN, TiNi, and TiN,
wherein the gate oxide layer comprises at least one material selected from a group consisting of $SiO_2$, $Al_2O_3$, and $HfO_2$,
wherein the source layer comprises at least one material selected from a group consisting of: Pt, Ir, Pd, Au, Ti, Ta, Cu, Iridium Tin Oxide (ITO),
wherein the drain layer comprises at least one material selected from a group consisting of: Pt, Ir, Pd, Au, Ti, Ta, Cu, and ITO,
wherein the channel layer comprises at least one material selected from a group consisting of: $ZnO_2$, InZnO, InGaZnO, pentacene, poly(3-hexylthiophene) (P3HT), and alkyl-substituted triphenylamine polymers (PTAA), and wherein the contact pad layer comprises at least one material selected from a group consisting of: Au, Ag, and Ta.

7. The method as recited in claim 1, wherein removing the rigid substrate from below the pMTJ structure comprises:
adhering a lift layer to an upper surface of a bit line layer positioned above the pMTJ structure, the lift layer comprising polydimethylsiloxane (PDMS); and etching, using concentrated hot phosphoric acid (H$_3$PO$_4$), a sacrificial buried layer located below the pMTJ structure and above the rigid substrate to release the pMTJ structure from the rigid substrate.

8. The method as recited in claim 1, wherein forming the pMTJ structure comprises:
   forming a sacrificial buried layer above the rigid substrate in a film thickness direction;
   forming the adhesion layer above the sacrificial buried layer in the film thickness direction;
   forming a bottom electrode layer above the adhesion layer in the film thickness direction;
   forming a pMTJ above the bottom electrode layer in the film thickness direction;
   forming an upper electrode layer above the pMTJ in the film thickness direction;
   patterning the adhesion layer, the bottom electrode, the pMTJ, and the upper electrode layer to form a pillar via a material removal process;
   forming a second insulative layer around the pillar to an upper extent of the upper electrode layer in the film thickness direction;
   forming a channel through the second insulative layer that is separated from a side of the pillar by a portion of the second insulative layer; and
   forming a bit line layer above the second insulative layer, an exposed portion of the sacrificial buried layer and the upper electrode layer, and along sides of the channel.

9. The method as recited in claim 8, wherein the sacrificial buried layer has a thickness of about 50 nm to about 100 nm and comprises at least one material selected from a group consisting of: SiN, SiGe, and amorphous silicon ($\alpha$-Si), and wherein the bit line layer comprises at least one material selected from a group consisting of: W, TaN, TiNi, TiN, and TiW.

* * * * *

UNITED STATES PATENT AND TRADEMARK OFFICE
CERTIFICATE OF CORRECTION

PATENT NO. : 10,790,333 B2  
APPLICATION NO. : 15/859074  
DATED : September 29, 2020  
INVENTOR(S) : Kuk-Hwan Kim et al.

Page 1 of 1

It is certified that error appears in the above-identified patent and that said Letters Patent is hereby corrected as shown below:

On the Title Page

In item (71) "Applicant":  
Please replace "Spin Memory, Inc." with --Spin Memory, Inc., Fremont, CA (US)--.

In the Specification

Column 17, Line 66, please replace "Pt, Jr" with --Pt, Ir--.

In the Claims

Column 22, Line 52, please replace "Iridium" with --Indium--.

Signed and Sealed this  
Twentieth Day of April, 2021

Drew Hirshfeld  
*Performing the Functions and Duties of the  
Under Secretary of Commerce for Intellectual Property and  
Director of the United States Patent and Trademark Office*